(12) United States Patent
Miyasaka

(10) Patent No.: US 9,368,940 B2
(45) Date of Patent: Jun. 14, 2016

(54) SEMICONDUCTOR DEVICE AND MANUFACTURING METHOD OF SEMICONDUCTOR DEVICE

(71) Applicant: Renesas Electronics Corporation, Kawasaki-shi, Kanagawa (JP)

(72) Inventor: Fumito Miyasaka, Kanagawa (JP)

(73) Assignee: Reneas Electronics Corporation, Kanagawa (JP)

( * ) Notice: Subject to any disclaimer, the term of this patent is extended or adjusted under 35 U.S.C. 154(b) by 0 days.

(21) Appl. No.: 14/697,908

(22) Filed: Apr. 28, 2015

(65) Prior Publication Data

US 2015/0349496 A1 Dec. 3, 2015

(30) Foreign Application Priority Data

May 30, 2014 (JP) ................................. 2014-112268

(51) Int. Cl.
| | |
|---|---|
| *H01S 5/00* | (2006.01) |
| *H01S 5/343* | (2006.01) |
| *H01S 5/32* | (2006.01) |
| *H01S 5/323* | (2006.01) |
| *H01S 5/022* | (2006.01) |
| *H01S 5/34* | (2006.01) |

(52) U.S. Cl.
CPC ......... *H01S 5/34333* (2013.01); *H01S 5/02296* (2013.01); *H01S 5/3202* (2013.01); *H01S 5/32341* (2013.01); *H01S 5/34346* (2013.01); *H01S 5/34* (2013.01)

(58) Field of Classification Search
CPC ............ H01S 5/34333; H01S 5/34346; H01S 5/3202; H01S 5/34; H01S 5/32341; H01S 5/02296
USPC .......................................... 372/44.011, 45.01
See application file for complete search history.

(56) References Cited

U.S. PATENT DOCUMENTS

| | | | | |
|---|---|---|---|---|
| 7,652,299 | B2 * | 1/2010 | Urashima | ............... H01L 33/20 257/95 |
| 8,270,450 | B2 * | 9/2012 | Sawahata | ............... B82Y 20/00 372/103 |
| 2005/0151153 | A1 * | 7/2005 | Kamikawa | ............ H01S 5/3202 257/103 |
| 2006/0094244 | A1 * | 5/2006 | Yamada | ............. H01L 21/0237 438/700 |
| 2015/0270686 | A1 * | 9/2015 | Takagi | .................. H01S 5/0014 372/45.01 |

FOREIGN PATENT DOCUMENTS

| | | |
|---|---|---|
| JP | 2000-196188 A | 7/2000 |
| JP | 2003-60298 A | 2/2003 |
| JP | 2011-124253 A | 6/2011 |

* cited by examiner

*Primary Examiner* — Kinam Park
(74) *Attorney, Agent, or Firm* — Sughrue Mion, PLLC

(57) ABSTRACT

To provide a semiconductor laser that suppresses end face destruction due to catastrophic optical damage (COD) to a light emission end face and has high output characteristics. An n-type clad layer, a current block layer, an active layer, and a p-type clad layer are provided over an n-type substrate whose major plane has an off-angle in a <1-100> direction from a (0001) plane. For example, the current block layer is arranged on both sides of a current constriction area. Then, the current block layer is arranged so as to be retracted from a cleavage plane (line). In this case, in the active layer having a quantum well structure that is crystal-grown over the n-type clad layer and the current block layer, the layer thickness of a window area from the cleavage plane (line) up to the end part of the current block layer is smaller than the layer thickness of the current constriction area (area between the current block layers). As a result, the band gap of the active layer in the window area becomes large, and thus it is possible to suppress end face destruction due to the COD.

20 Claims, 41 Drawing Sheets

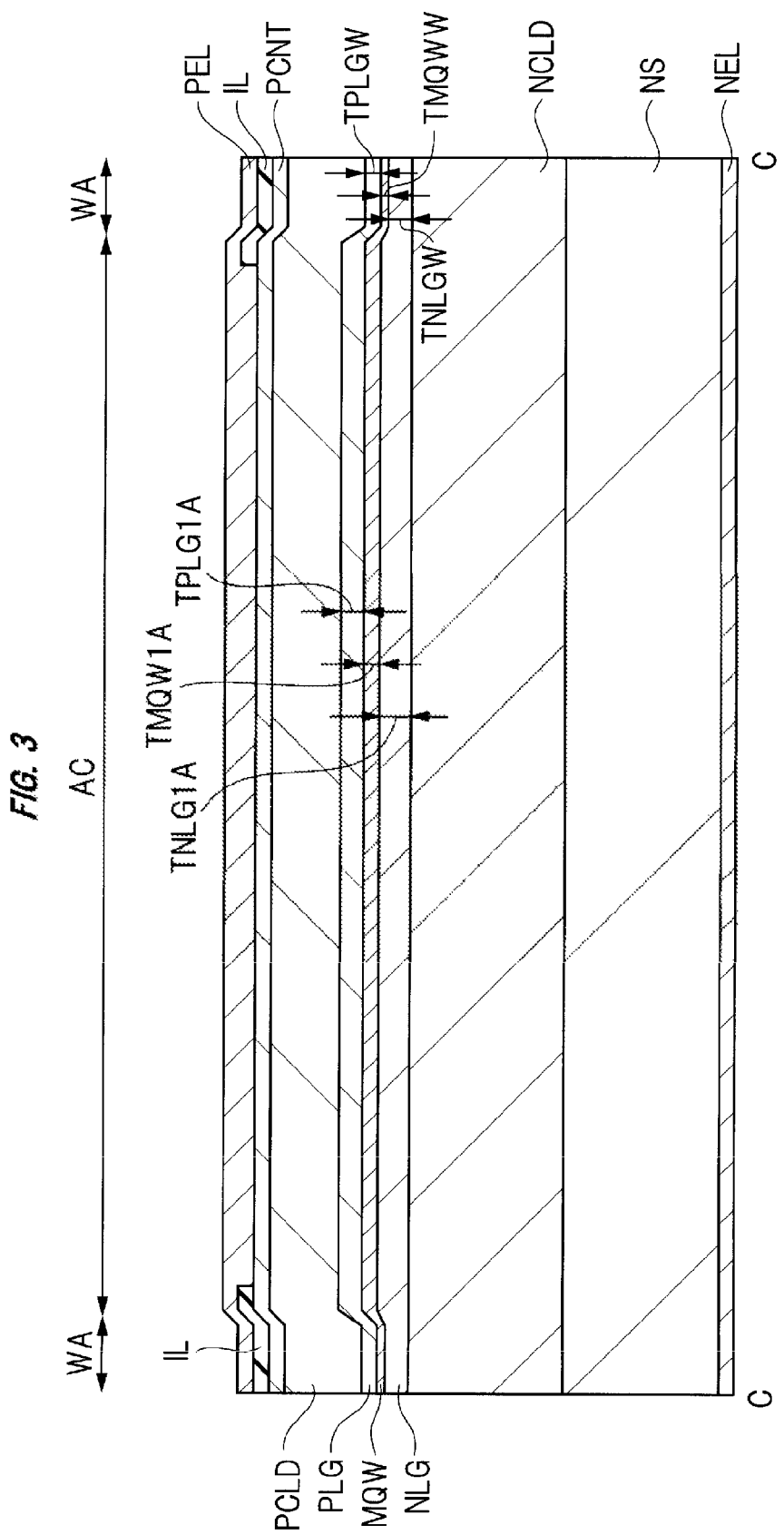

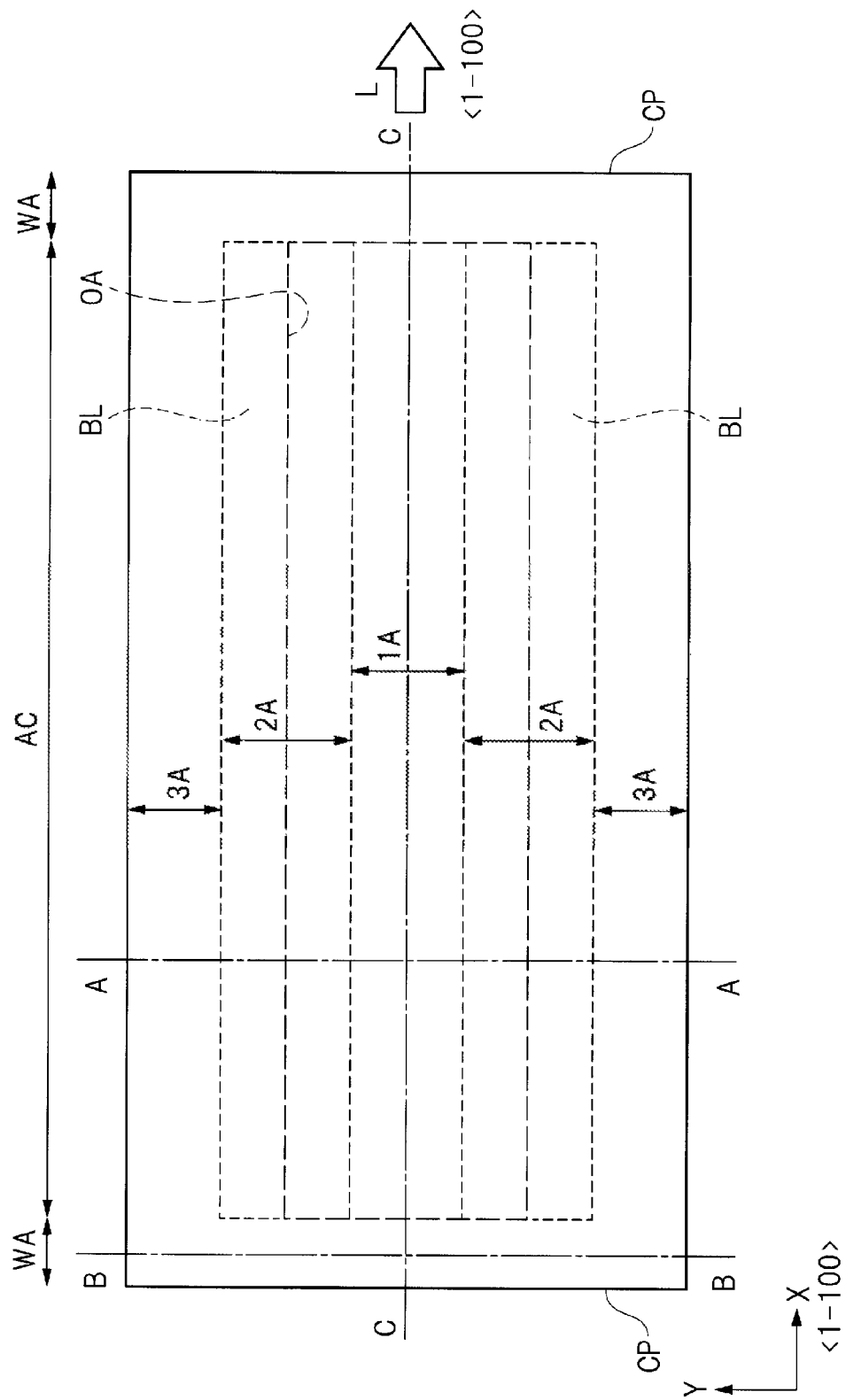

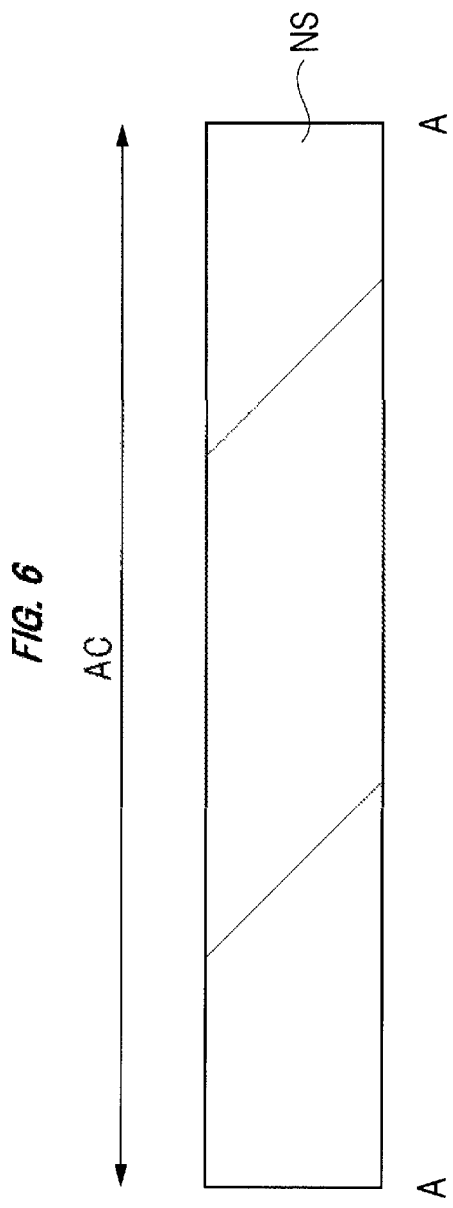

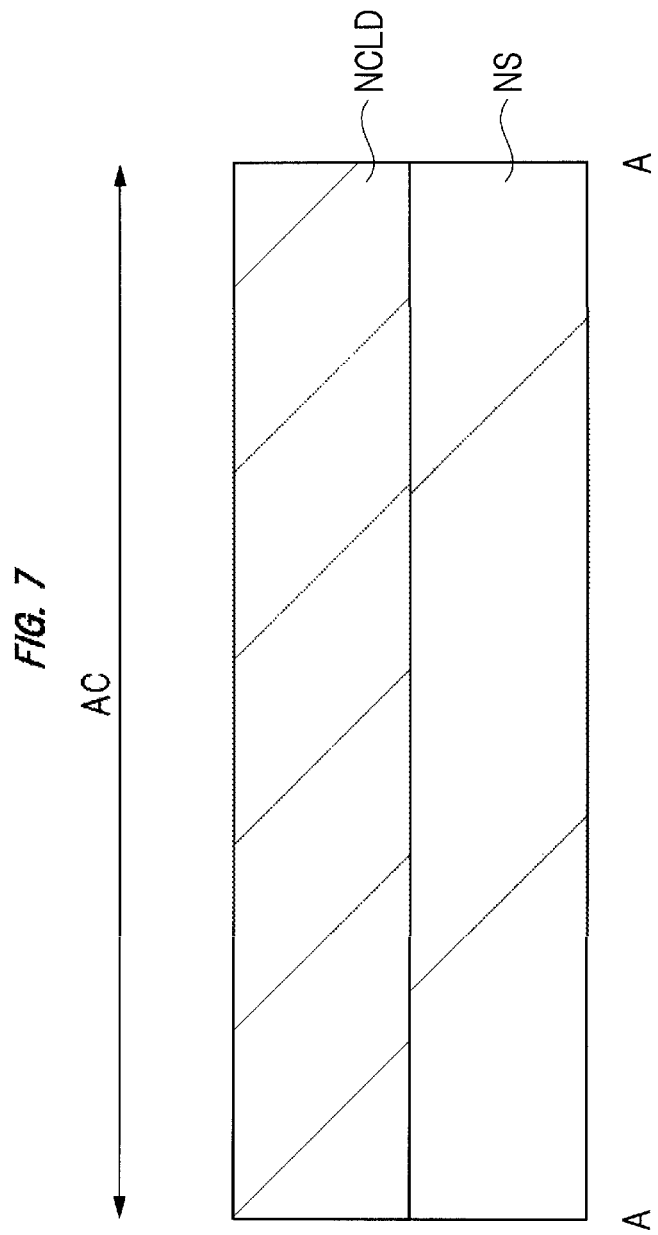

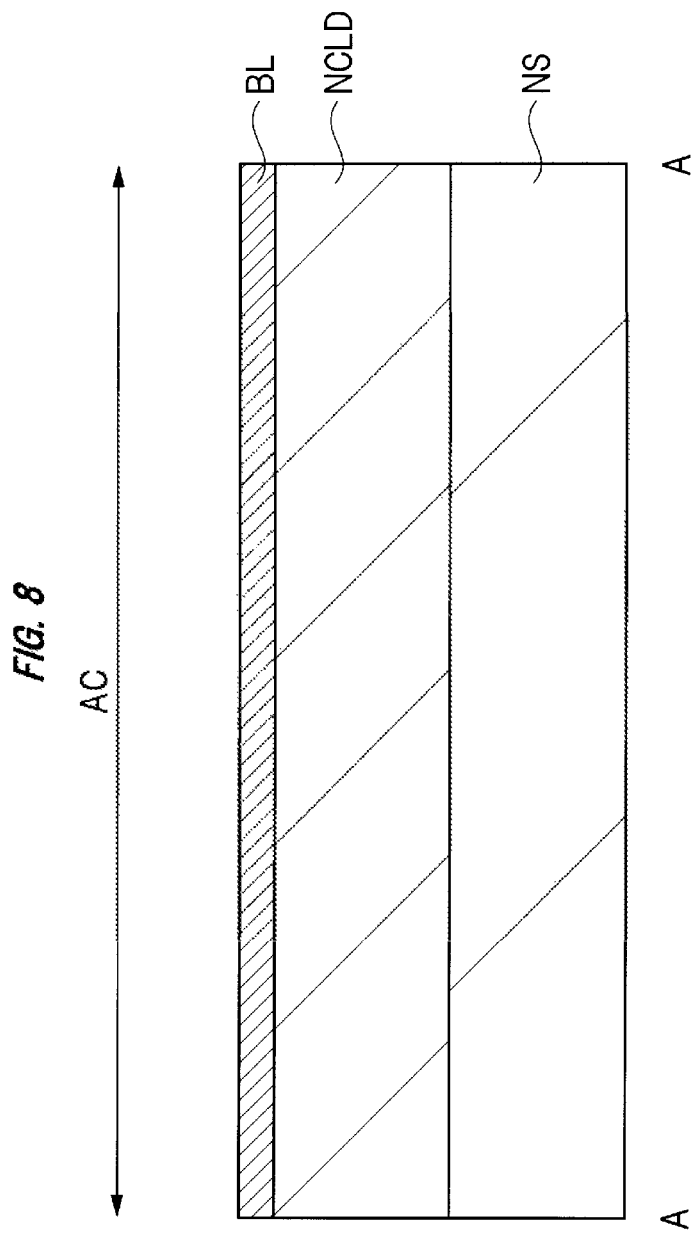

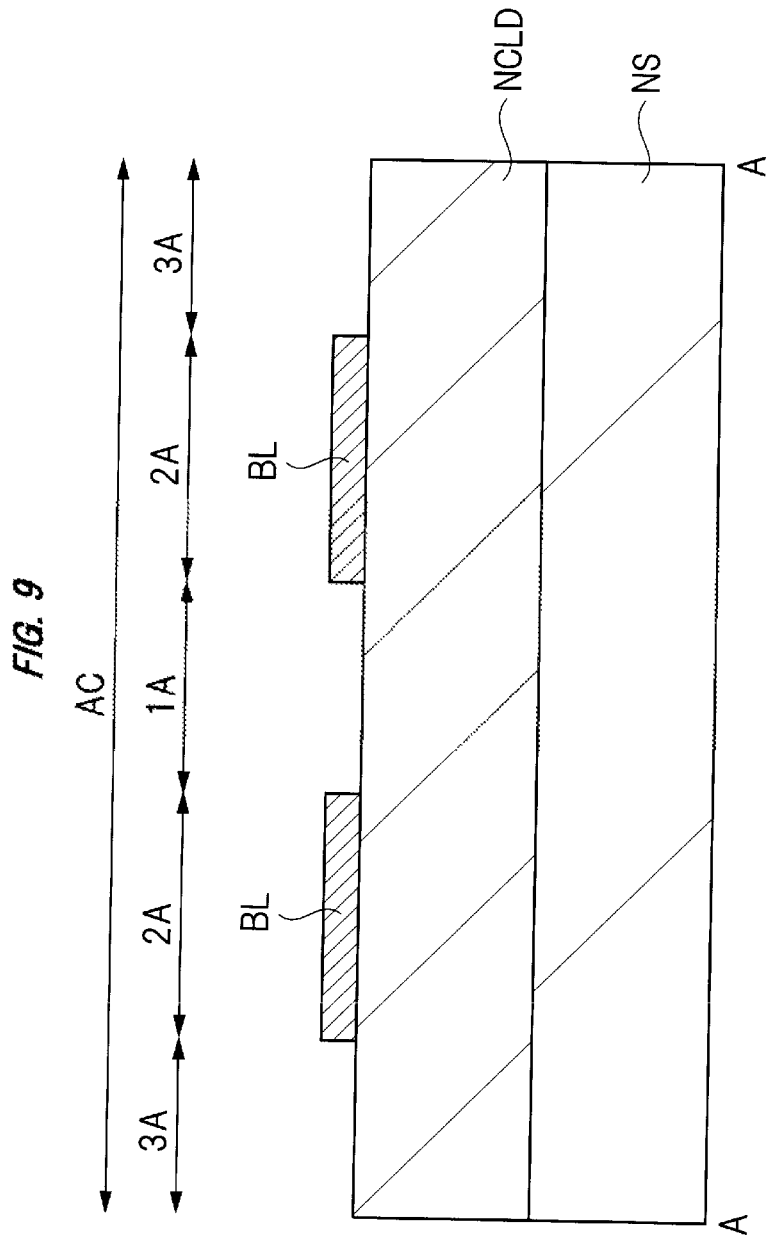

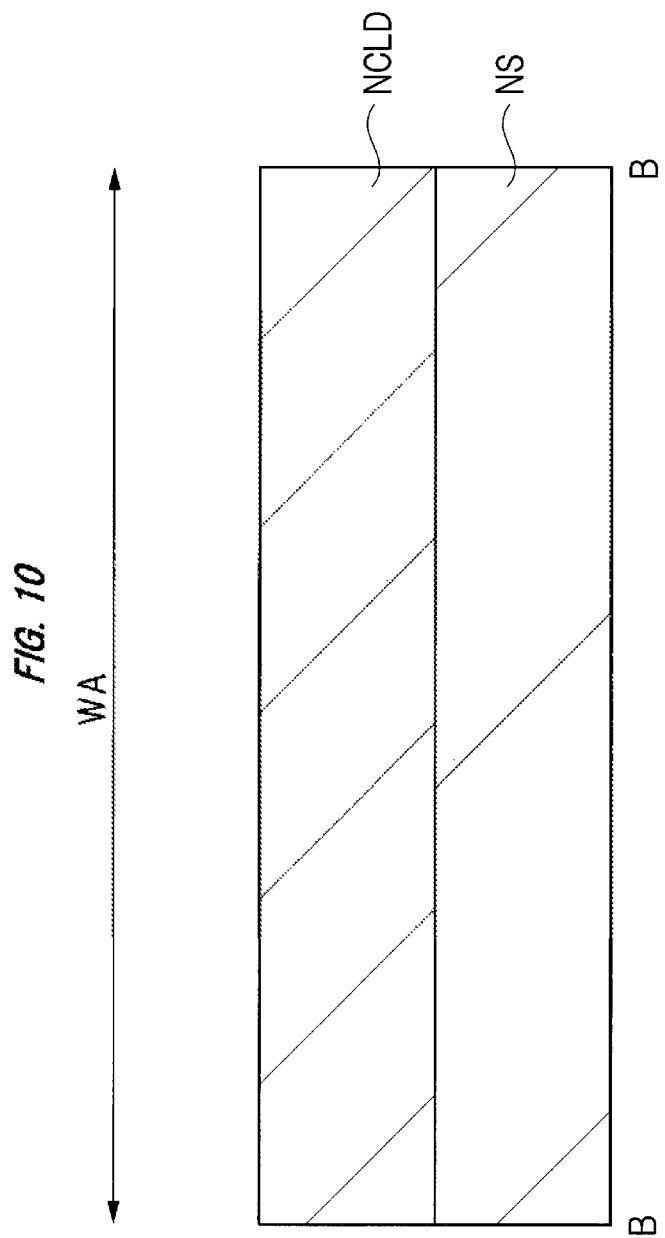

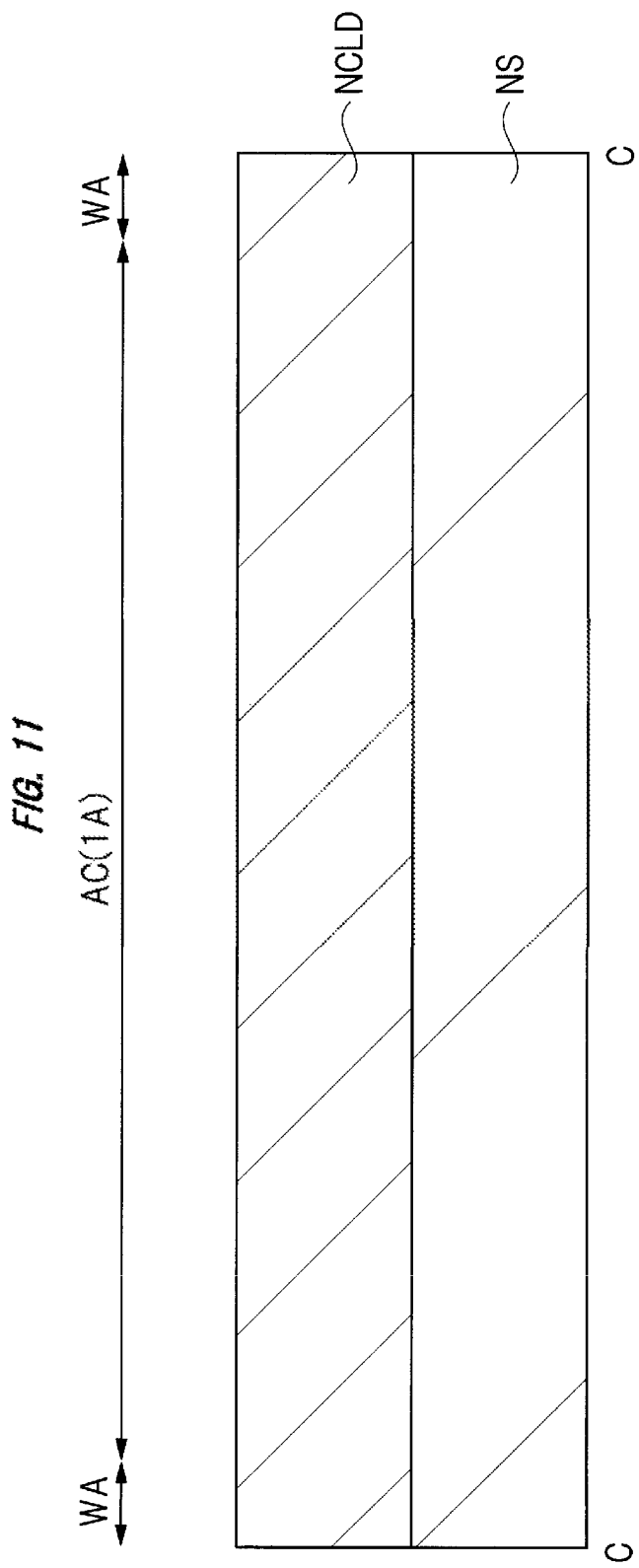

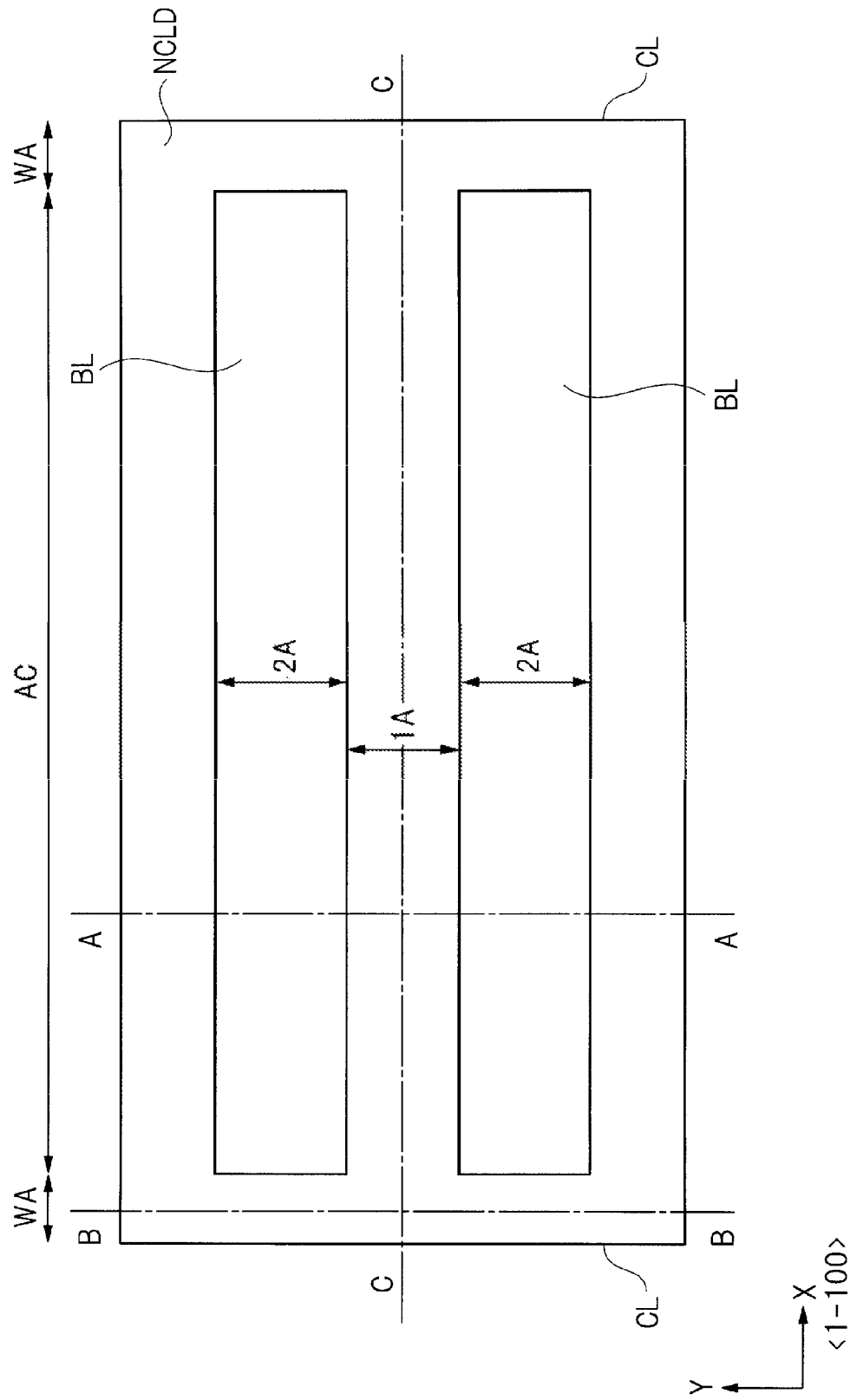

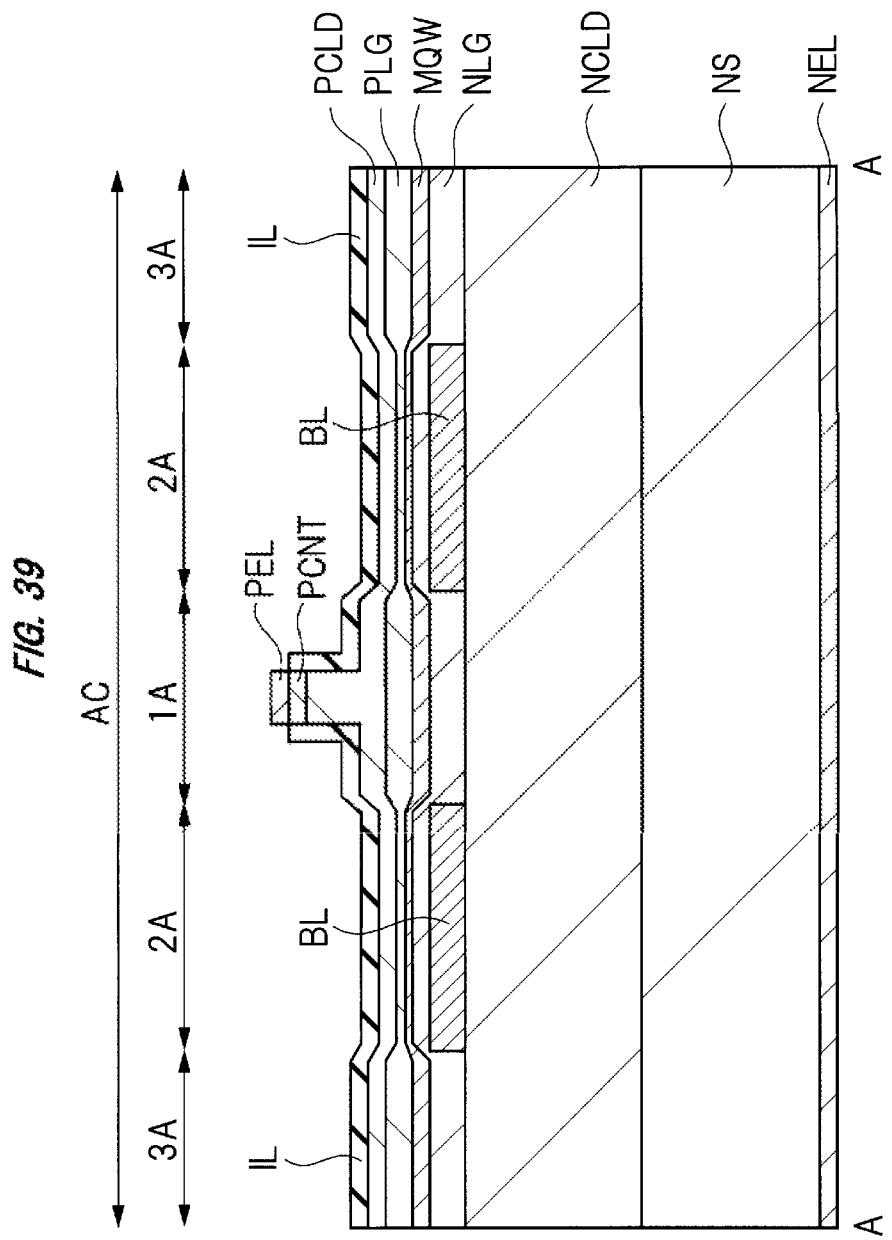

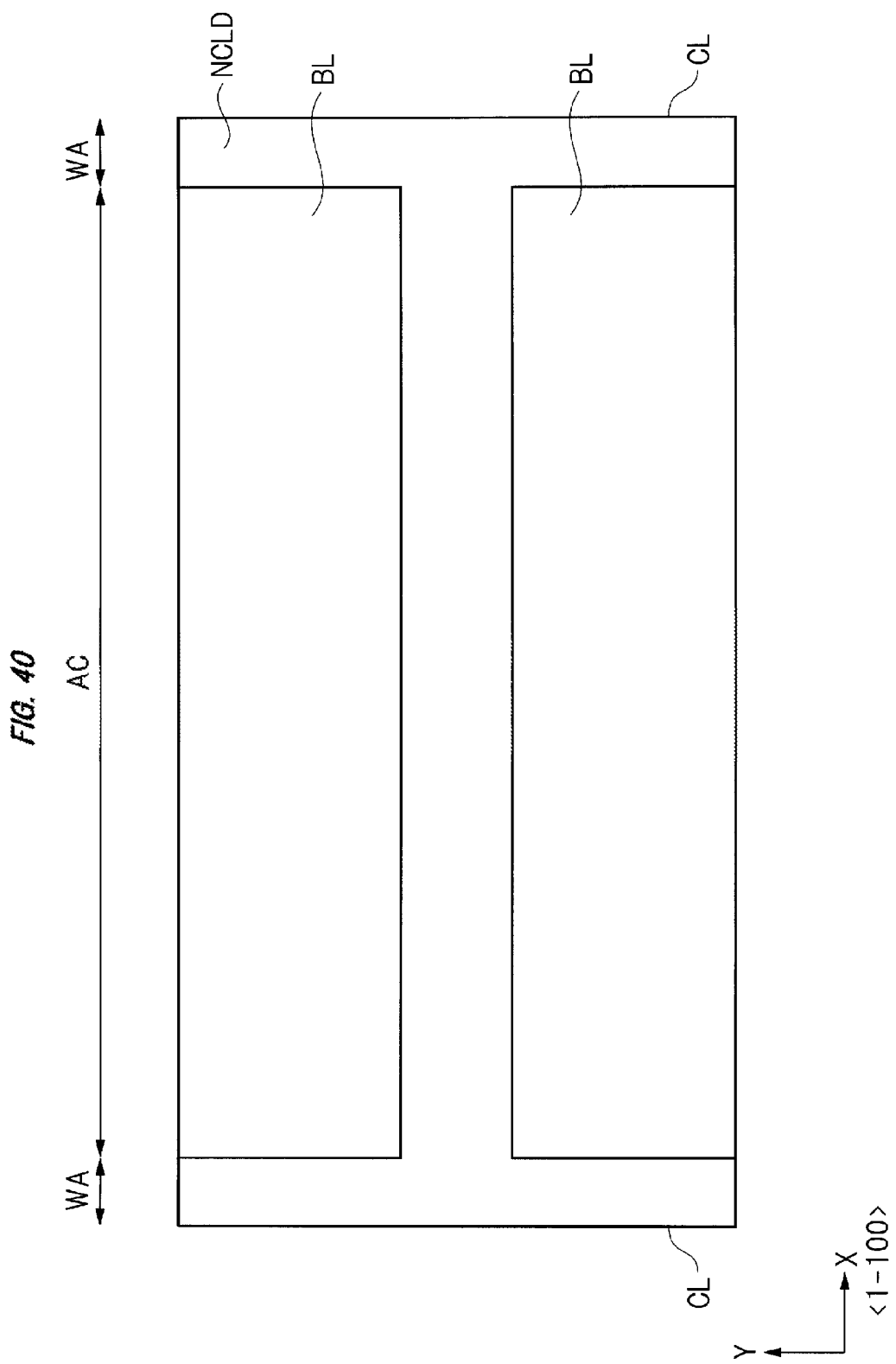

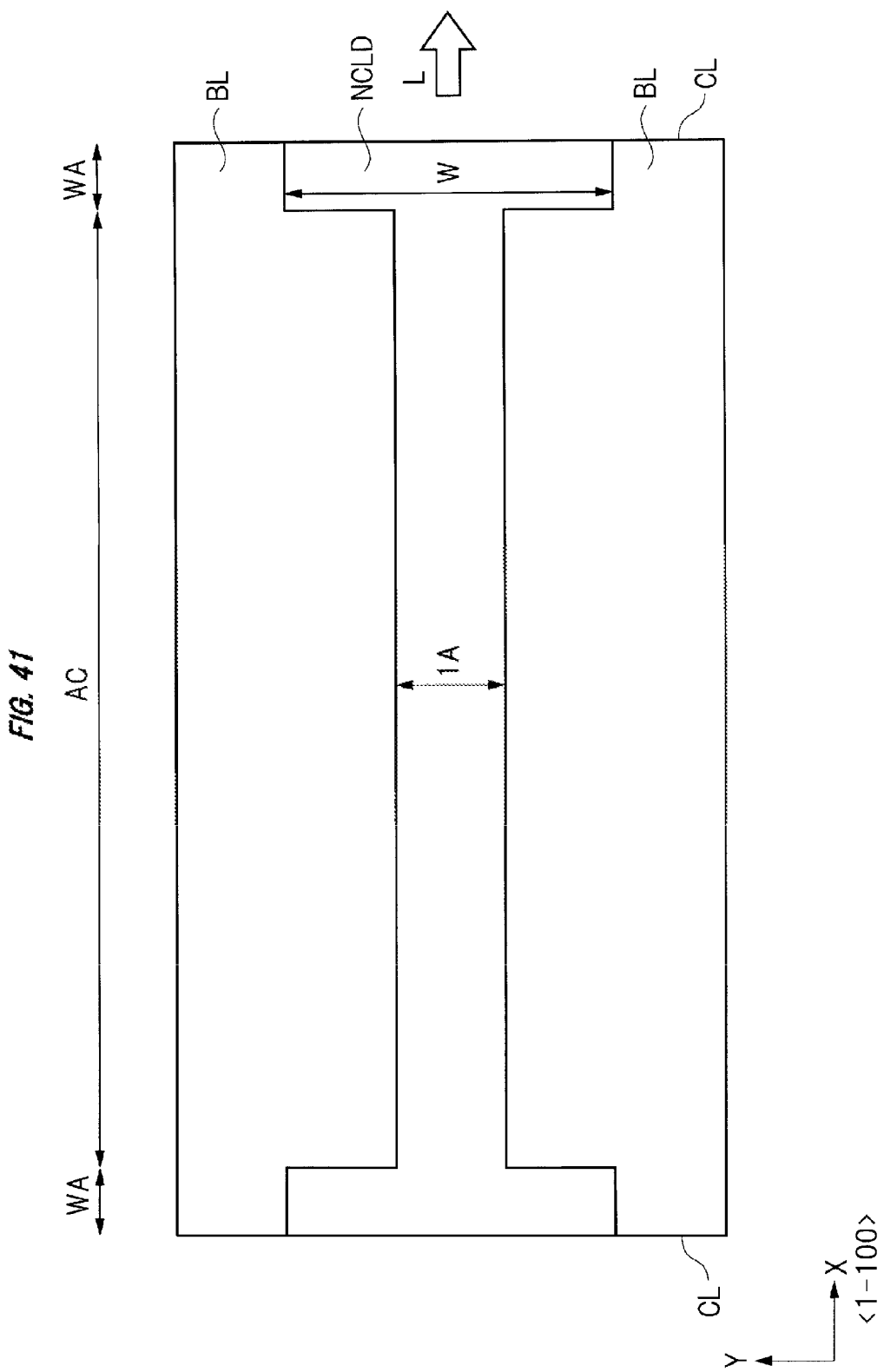

SEMICONDUCTOR DEVICE AND MANUFACTURING METHOD OF SEMICONDUCTOR DEVICE

CROSS-REFERENCE TO RELATED APPLICATION

The disclosure of Japanese Patent Application No. 2014-112268 filed on May 30, 2014 including the specification, drawings and abstract is incorporated herein by reference in its entirety.

BACKGROUND

The present invention relates to a semiconductor device and a manufacturing method of a semiconductor device, and can be suitably used, for example, for a semiconductor laser using a nitride semiconductor and a manufacturing method of a semiconductor laser.

Development of a semiconductor laser as a light source of various kinds of electronic equipment is in progress. In particular, the nitride semiconductor has a sufficiently large forbidden band gap and the transition between bands is a direct transition type, and thus the development of the semiconductor laser using the nitride semiconductor as a short-wavelength semiconductor laser is in progress. For example, it has been discussed to use the semiconductor laser using the nitride semiconductor as a light source of a display, such as a high-density optical disc and a projector, or an industrial device, such as a sensor and an exposure device.

For example, in Japanese Patent Laid-Open No. 2000-196188 (Patent document 1), a gallium nitride-based compound semiconductor laser element having an MQW active layer of InGaN has been disclosed. Then, the MQW active layer of InGaN of the light emission end face part is arranged in a position lower than those of other portions.

Furthermore, in Japanese Patent Laid-Open No. 2003-60298 (Patent document 2), a semiconductor light emitting element having a gallium nitride based compound semiconductor layer has been disclosed. Then, the emission side end face of the element is covered with a single crystal layer having a large band gap.

Furthermore, in Japanese Patent Laid-Open No. 2011-124253 (Patent document 3), a nitride-based group III-V compound semiconductor based semiconductor laser has been disclosed. Then, the In composition of the active layer of the portion that forms the end face window structure of the semiconductor laser is smaller than those of other portions.

SUMMARY

The inventors of the present invention have been engaged with the research and development of the semiconductor laser using the nitride semiconductor and have intensively examined improvement in performance thereof. In the process thereof, it has been found that there is still room for further improvement in the structure and the manufacturing method in order to improve the performance of the semiconductor laser using the nitride semiconductor.

The other tasks and the new feature will become clear from the description of the present specification and the accompanying drawings.

The following explains briefly the outline of a typical invention among the inventions disclosed in the present application.

In a semiconductor device shown in an embodiment disclosed in the present application, the layer thickness of an active layer in a window area is made smaller than the layer thickness of the active layer in a current constriction area.

In a manufacturing method of a semiconductor device shown in an embodiment disclosed in the present application, a current block layer is formed on both sides of a first area in an active layer over a clad layer formed over a substrate having the active area and a window area and whose major plane has an off-angle in a <1-100> direction from a (0001) plane, and an active layer is formed over the clad layer and the current block layer. Then, the layer thickness of the window area of the active layer is smaller than the layer thickness of the first area.

According to the semiconductor device shown in a typical embodiment disclosed in the present application and shown below, it is possible to enhance characteristics of the semiconductor device.

According to the manufacturing method of a semiconductor device shown in a typical embodiment disclosed in the present application and shown below, it is possible to manufacture a semiconductor device whose characteristics are favorable.

BRIEF DESCRIPTION OF THE DRAWINGS

FIG. 3 is a cross-sectional view showing the configuration of the semiconductor laser of the first embodiment;

FIG. 4 is a plan view showing the configuration of the semiconductor laser of the first embodiment;

FIG. 6 is a cross-sectional view showing a manufacturing process of a semiconductor laser of the first embodiment;

FIG. 7 is a cross-sectional view showing the manufacturing process of the semiconductor laser of the first embodiment, a cross-sectional view showing the manufacturing process that follows FIG. 6;

FIG. 8 is a cross-sectional view showing the manufacturing process of the semiconductor laser of the first embodiment, a cross-sectional view showing the manufacturing process that follows FIG. 7;

FIG. 9 is a cross-sectional view showing the manufacturing process of the semiconductor laser of the first embodiment, a cross-sectional view showing the manufacturing process that follows FIG. 8;

FIG. 10 is a cross-sectional view showing the manufacturing process of the semiconductor laser of the first embodiment;

FIG. 11 is a cross-sectional view showing the manufacturing process of the semiconductor laser of the first embodiment;

FIG. 12 is a plan view showing the manufacturing process of the semiconductor laser of the first embodiment;

FIG. 39 is a cross-sectional view showing the manufacturing process of the semiconductor laser of the second embodiment, a cross-sectional view showing the manufacturing process that follows FIG. 38;

FIG. 40 is a plan view showing a first example of a semiconductor laser of a third embodiment; and FIG. 41 is a plan view showing a second example of the semiconductor laser of the third embodiment.

DETAILED DESCRIPTION

Figure 1:
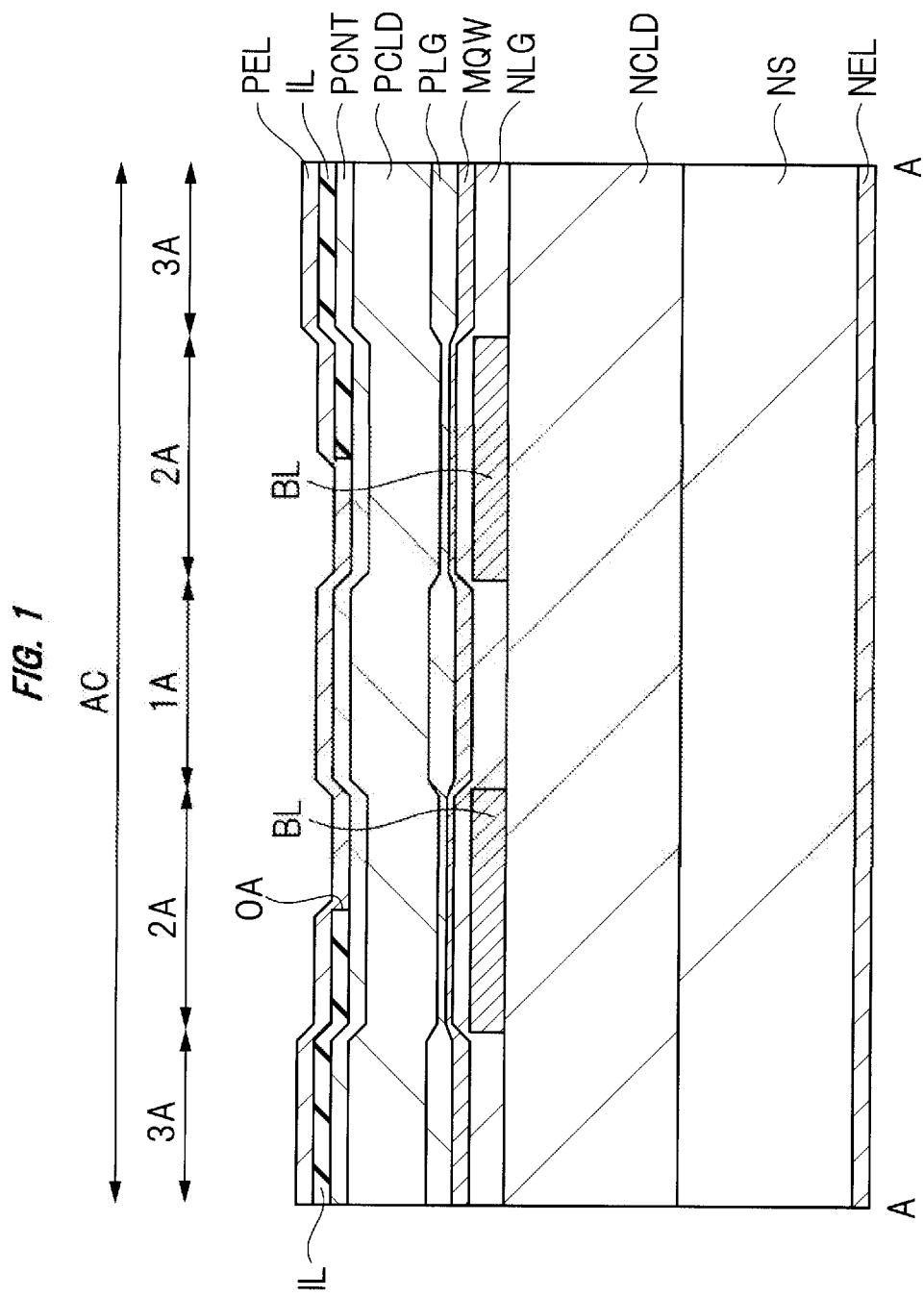
FIG. 1 is a cross-sectional view showing a configuration of a semiconductor laser of a first embodiment.

The following embodiments will be explained, divided into plural sections or embodiments, if necessary for convenience. Except for the case where it shows clearly in particular, they are not mutually unrelated and one has relationships such as a modification, an application example, detailed explanation, and supplementary explanation of some or entire of another. In addition, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the number, etc. (including the number, a numeric value, an amount, a range, etc.) described above.

Hereinafter, embodiments will be explained in detail on the basis of the drawings. Note that, in all the drawings for explaining the embodiments, the same or related symbol is attached to the member having the same function and the repeated explanation thereof is omitted. In addition, in the case where there exists a plurality of similar members (regions), a symbol may be added to the generic symbol to thereby specify the individual or specific region. Furthermore, in the following embodiments, explanation of the same or a similar portion is not repeated, in principle, if not particularly necessary.

In addition, in the drawing to be used in the following embodiments, in order to make a drawing visible, hatching may be omitted even if it is a cross-sectional view. Furthermore, in order to make a drawing visible, hatching may be attached even if it is a plan view.

In addition, in the cross-sectional view or plan view, the size of each region does not correspond to the size of the actual device and in order to make the drawing intelligible, a specific region may be displayed relatively enlarged. Furthermore, also in the case where the cross-sectional view and the plan view correspond to each other, in order to make the drawing intelligible, a specific region may be displayed relatively enlarged.

(First Embodiment)

Figure 2:
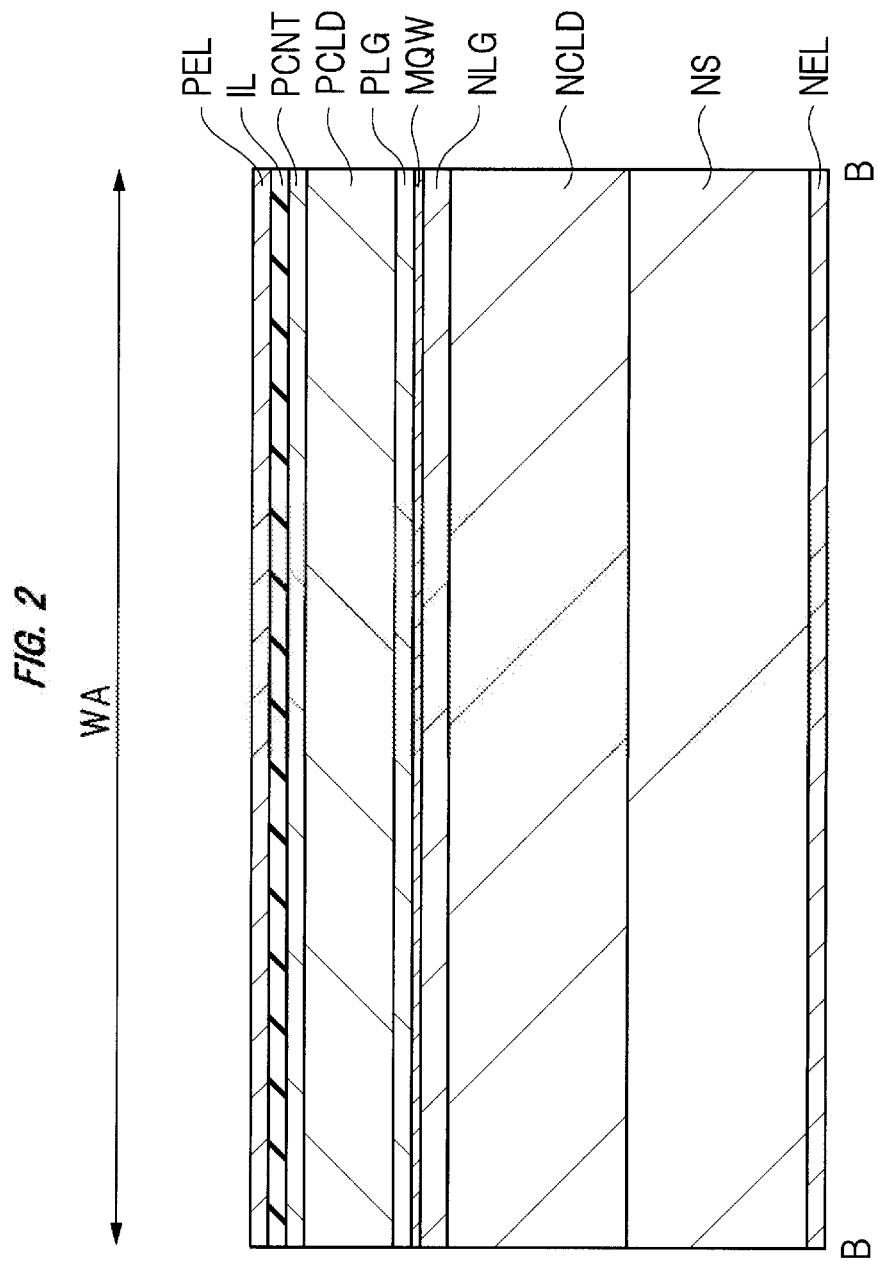
FIG. 2 is a cross-sectional view showing the configuration of the semiconductor laser of the first embodiment.

Hereinafter, a semiconductor laser (semiconductor device) of the present embodiment will be explained in detail with reference to the drawings. FIG. 1 to FIG. 3 are cross-sectional views showing a configuration of the semiconductor laser of the present embodiment and FIG. 4 is a plan view showing the configuration of the semiconductor laser of the present embodiment. For example, FIG. 1 corresponds to an A-A portion in FIG. 4, FIG. 2 corresponds to a B-B portion in FIG. 4, and FIG. 3 corresponds to a C-C portion in FIG. 4.

[Explanation of Structure]

As shown in FIG. 1, the semiconductor laser of the present embodiment uses an n-type substrate NS as a substrate and has a plurality of nitride semiconductor layers sequentially stacked thereover. Specifically, an n-type clad layer NCLD, an n-type optical guide layer NLG, an active layer MQW, a p-type optical guide layer PLG, a p-type clad layer PCLD, and a p-type contact layer PCNT are arranged over the n-type substrate NS in order from bottom. As described above, the semiconductor laser of the present embodiment has a structure in which the active layer MQW is sandwiched by the nitride semiconductors of the opposite conductive type arranged in the upper layer and in the lower layer.

Then, a p-side electrode PEL is arranged over the p-type contact layer PCNT in the uppermost layer and an n-side electrode NEL is arranged at the backside of the n-type substrate NS. The p-type contact layer PCNT and the p-side electrode PEL are in contact with each other via an opening OA in an insulating layer (insulating film) IL.

Here, in the semiconductor laser of the present embodiment, a current block layer (current block film, current block area) BL is arranged between the n-type clad layer NCLD and the n-type optical guide layer NLG. The current block layer BL is arranged on both sides of an area 1A and the area between the current block layers BL, namely, the area 1A serves as a current constriction area.

Hereinafter, the operation of the semiconductor laser will be explained briefly.

First, a positive voltage is applied to the p-side electrode PEL and a negative voltage is applied to the n-side electrode NEL. Due to this, a forward current flows from the p-side electrode PEL toward the n-side electrode NEL and positive holes are implanted from the p-side electrode PEL into the active layer MQW via the p-type contact layer PCNT, the p-type clad layer PCLD, and the p-type optical guide layer PLG. On the other hand, from the n-side electrode NEL, electrons are implanted into the n-type substrate NS and the implanted electrons are implanted into the active layer MQW via the n-type clad layer NCLD and the n-type optical guide layer NLG. Then, the area of the forward current that flows from the p-side electrode PEL toward the n-side electrode NEL is restricted by the block layer BL, and the area between the current block layers BL, namely, the area 1A serves as the current constriction area.

In the active layer MQW, an inverted population is formed by the implanted positive holes and electrons, the electrons transition from the conduction band to the valence band by induced emission, and thus light with phases matching with each other is produced. Then, the light generated in the active layer MQW is confined within the active layer MQW by the surrounding semiconductor layers (the p-type clad layer PCLD and the n-type clad layer NCLD) whose refractive index is lower than that of the active layer MQW. Furthermore, the light confined within the active layer MQW is amplified by induced emission by reciprocating resonators including cleavage planes (end faces, laser end faces, light emission end faces) formed in the semiconductor laser. After that, laser light L oscillates within the active layer MQW and the laser light L is emitted. At this time, the laser light L is emitted from the active layer MQW in a window area WA corresponding to the area (area 1A, current constriction area) between the current block layers BL (see FIG. 4).

Here, in the present embodiment, as will be explained later in detail, the current block layer BL is arranged so as to be retracted from the cleavage plane CP, which is the light emission end face. In other words, the current block layer BL is not formed in the window area WA, which is the area from the cleavage plane CP up to the current block layer BL (see FIG. 12). In addition, a layer thickness TMQWW of the active layer MQW in the window area WA that is arranged in the vicinity of the cleavage plane CP, which is the light emission end face, is smaller than a layer thickness TMQW1A of the active layer MQW formed between the current block layers BL (area 1A, current constriction area) (TMQWW<TMQW1A, see FIG. 3).

As described above, the band gap of the active layer MQW in the window area WA becomes large due to the quantum effect, by making the active layer MQW in the window area WA thinner than the active layer MQW in the current constriction area. Because of this, it is possible to suppress end face destruction due to catastrophic optical damage (COD) to the light emission end face. Details will be described later.

Hereinafter, the configuration of the semiconductor laser of the present embodiment will be explained in detail with reference to FIG. 1 to FIG. 4. As shown in the plan view in FIG. 4, the semiconductor laser of the present embodiment has, for example, an outline (chip area) in the shape of a rectangle having its long side in an X-direction. In addition, the semiconductor laser of the present embodiment has the window area WA and an active area AC.

The window area WA is an area in the shape of a rectangle that extends in a Y-direction and is arranged on both sides of the rectangular outline (chip area). The window area WA is the area from the cleavage plane CP up to the end part of the current block layer BL.

The active area AC is located between the window areas WA. Then, the two current block layers BL are arranged in the active area AC. The current block layer BL has the shape of a rectangle having its long side in the X-direction. The area between the two current block layers BL serves as the current constriction area. The current constriction area has the shape of a rectangle having its long side in the X-direction. Here, as shown in FIG. 4, in the active area AC, substantially the central portion corresponding to the current constriction area is shown as the area 1A, the areas on both sides of the area 1A, in which the current block layer BL is arranged, are shown as areas 2A, and areas further outside the regions 2A are shown as areas 3A.

FIG. 1 corresponds to the A-A cross-section in the plan view shown in FIG. 4. FIG. 2 corresponds to the B-B cross-section in the plan view shown in FIG. 4 and FIG. 3 corresponds to the C-C cross-section in the plan view shown in FIG. 4.

As described above, the n-type clad layer NCLD is arranged over the n-type substrate NS.

A substrate including gallium nitride (GaN) obtained by introducing n-type impurities (n-type GaN substrate) is used as the n-type substrate NS. Then, the n-type substrate NS has a (0001) plane inclined in a <1-100> direction as the major plane. In other words, the n-type substrate NS inclines in the <1-100> direction from the (0001) plane. In other words, the n-type substrate NS has an off-angle in the <1-100> direction from the (0001) plane. The angle of inclination (off-angle θ) is in a range of, for example, 0.1° to 3°, and preferably, in a range of 0.2° to 1°.

Figure 5A:
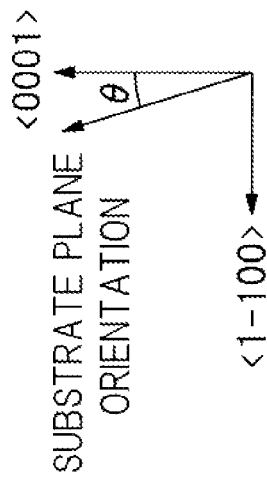
FIG. 5A is a diagram showing a GaN crystal structure and FIG. 5B is a diagram showing an off-angle.
Figure 5B:
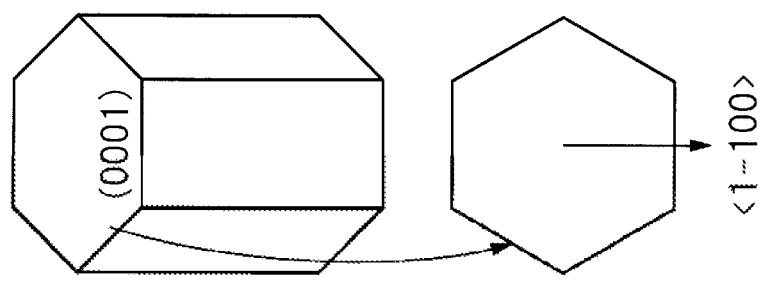
Figure 13:
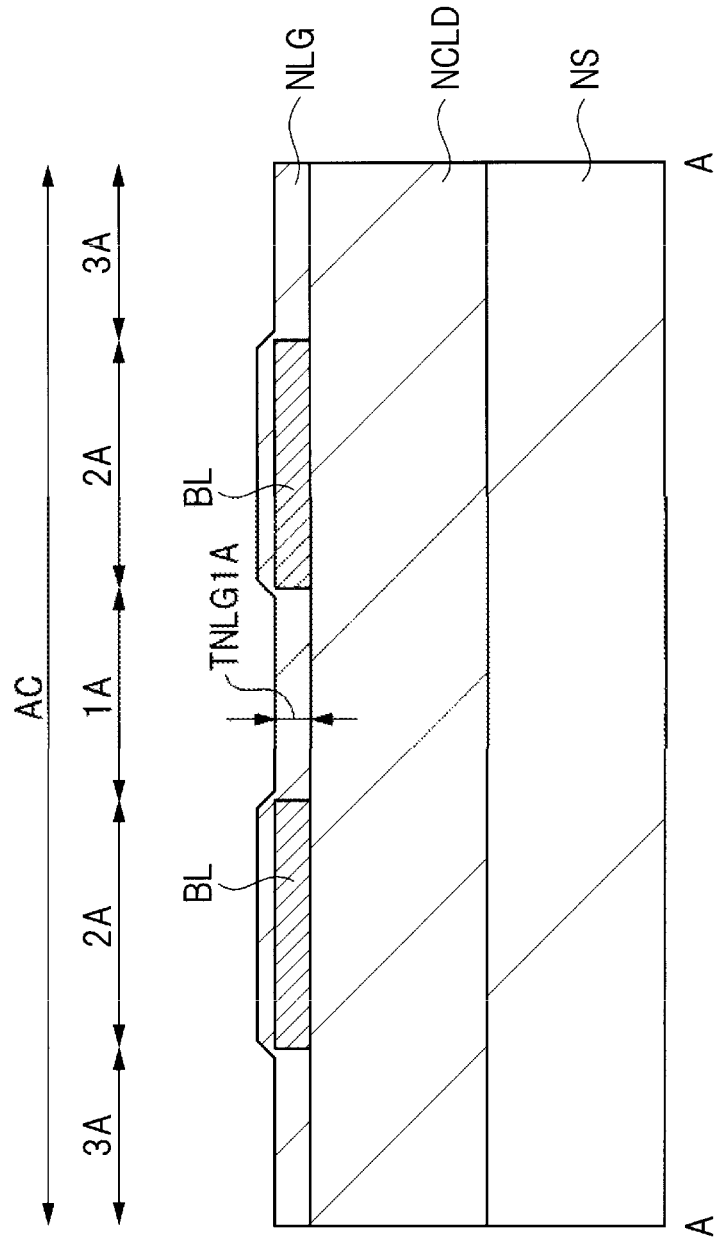
FIG. 13 is a cross-sectional view showing the manufacturing process of the semiconductor laser of the first embodiment, a cross-sectional view showing the manufacturing process that follows FIG. 9.
Figure 14:
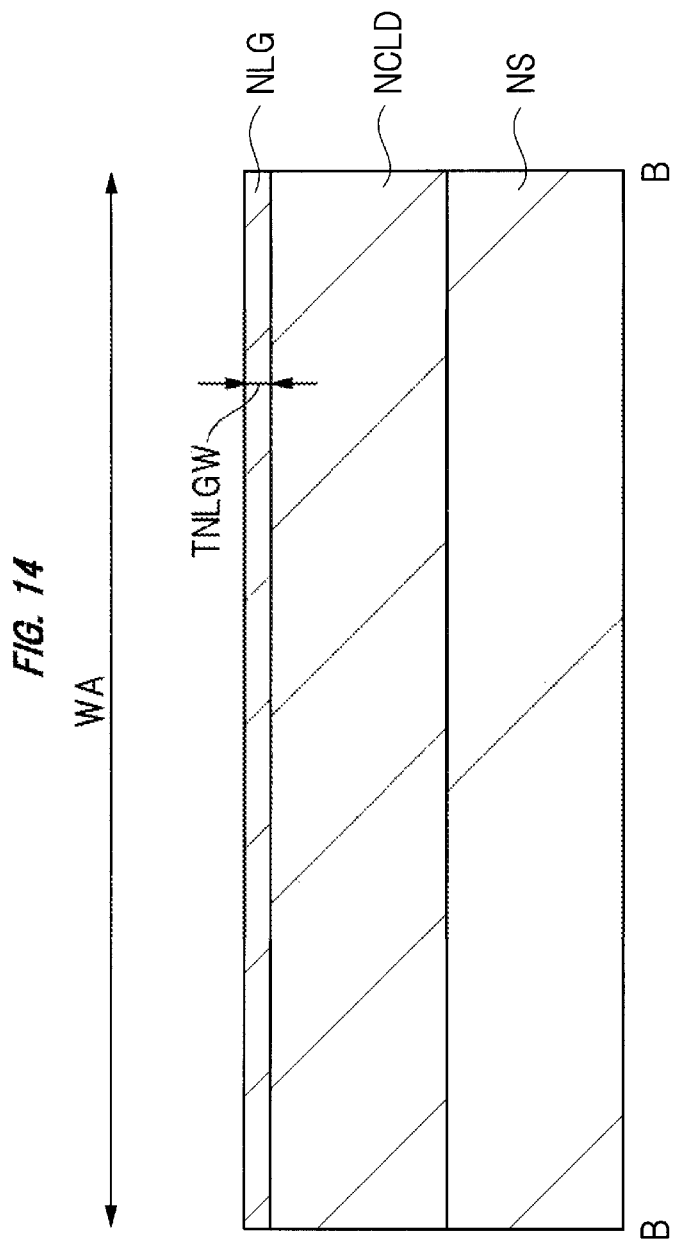
FIG. 14 is a cross-sectional view showing the manufacturing process of the semiconductor laser of the first embodiment, a cross-sectional view showing the manufacturing process that follows FIG. 10.
Figure 15:
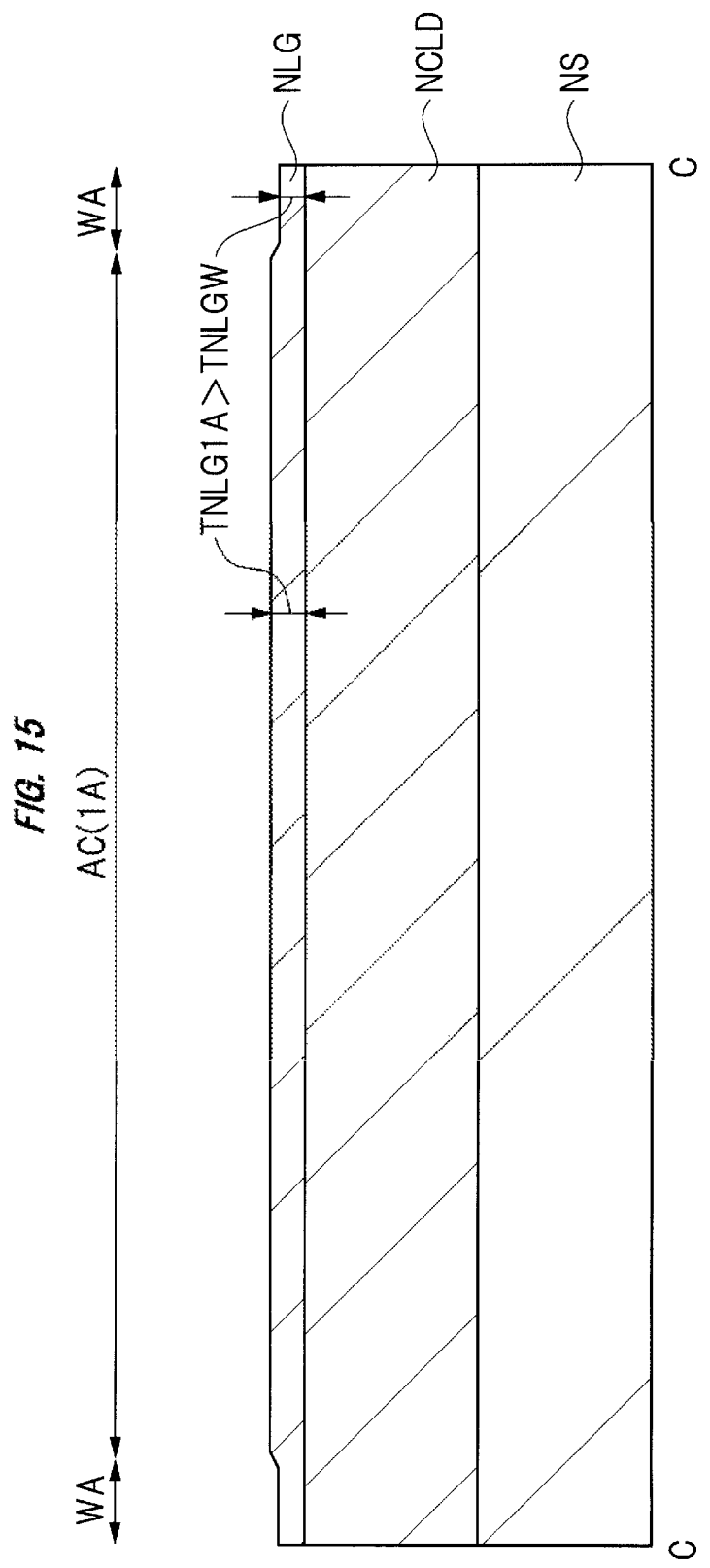
FIG. 15 is a cross-sectional view showing the manufacturing process of the semiconductor laser of the first embodiment, a cross-sectional view showing the manufacturing process that follows FIG. 11.
Figure 16:
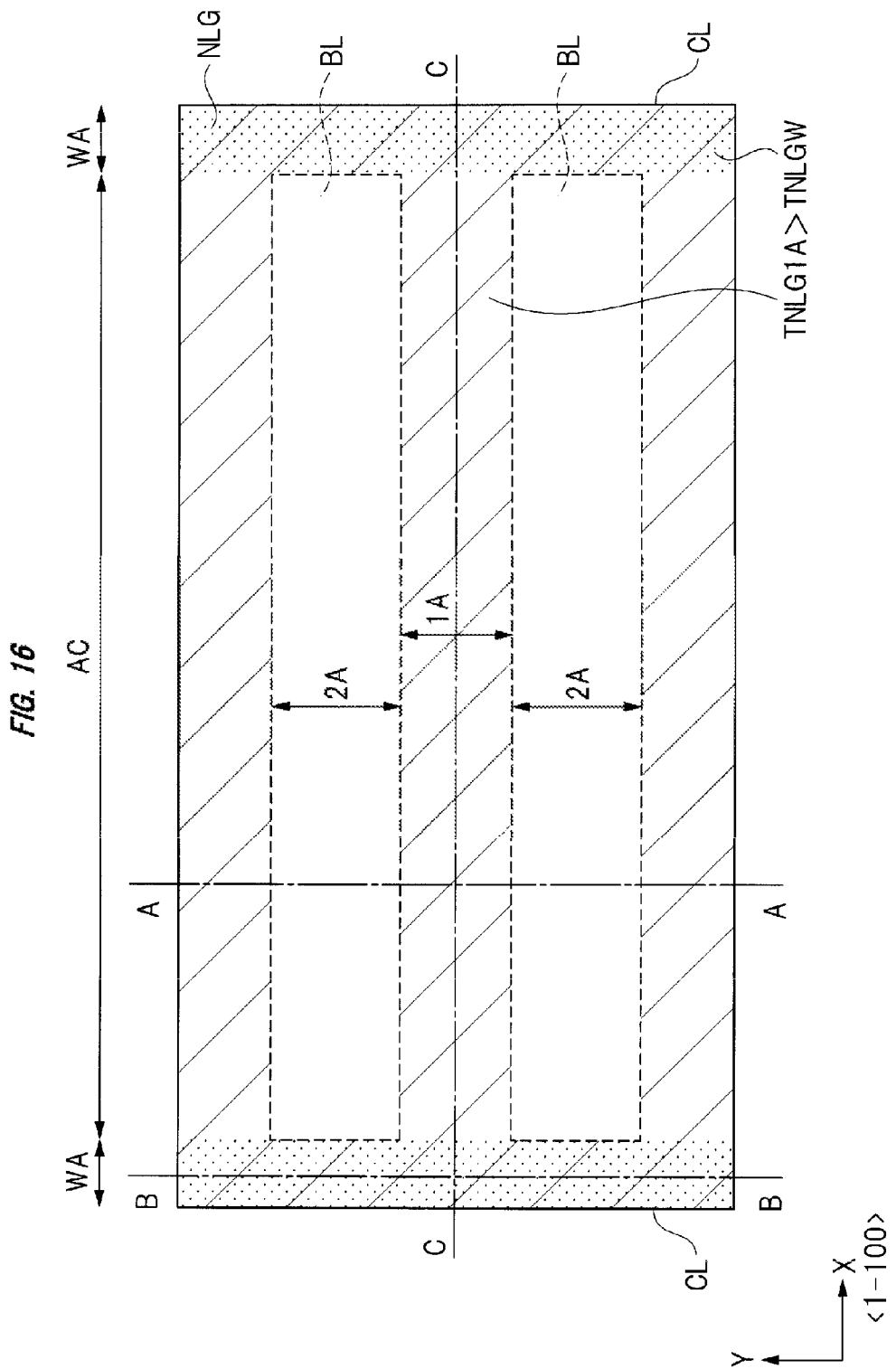
FIG. 16 is a plan view showing the manufacturing process of the semiconductor laser of the first embodiment.

FIG. 5A is a diagram showing a crystal structure of GaN and FIG. 5B is a diagram showing an off-angle. For example, the upper face of the hexagonal prism shown in FIG. 5A is the (0001) plane and the <1-100> direction is shown by an arrow. The plane inclined by the above-described off-angle θ with respect to the <1-100> direction serves as the major plane (FIG. 5B).

As described above, the layer formed by crystal growth over the n-type substrate NS inclined in the <1-100> direction from the (0001) plane is inclined in the <1-100> direction from the (0001) plane. In this way, the off-angle is also handed over to the layer over the n-type substrate NS.

For example, an aluminum gallium nitride layer obtained by introducing n-type impurities (n-type AlGaN layer) is used as the n-type clad layer NCLD. The thickness of the n-type clad layer (n-type AlGaN layer) NCLD is, for example, approximately 2 μm. The n-type clad layer NCLD is formed by, for example, crystal growth over the n-type substrate NS and the n-type clad layer NCLD has an off-angle in the <1-100> direction from the (0001) plane.

Furthermore, the current block layer BL is partially arranged over the n-type clad layer NCLD.

An aluminum nitride layer (AlN layer) is used as the current block layer BL. An aluminum gallium nitride layer (AlGaN layer) may also be used as the current block layer BL. The thickness of the current block layer (AlN layer) BL is, for example, approximately 0.1 μm. As described above, the current block layer BL has the shape of a rectangle having its long side in the X-direction and is arranged on both sides of the area 1A (see FIG. 4). The current block layer BL is grown, for example, over the n-type clad layer NCLD at comparatively low temperatures (e.g., temperatures lower than the growth temperature of the n-type clad layer NCLD). By such a forming method, it is possible to form the current block layer BL in an amorphous state, and thus processing (etching) of the current block layer BL easy.

As described above, the current block layer BL has the shape of a rectangle having its long side in the X-direction. The area between the current block layers BL forms the current constriction area. The current constriction area has the shape of a rectangle having its long side in the X-direction. In other words, the current block layer BL is arranged in the areas 2A on both sides of the area 1A (current constriction area) at the central portion of the active area AC. At this time, the current block layer BL is arranged so as to be retracted from the cleavage plane CP (see FIG. 4 and FIG. 12).

Furthermore, the n-type optical guide layer NLG is arranged over the n-type clad layer NCLD and the current block layer BL.

A gallium nitride layer into which n-type impurities are introduced (n-type GaN layer) is used as the n-type optical guide layer NLG. The n-type optical guide layer NLG has a plurality of layer-thickness portions. A layer thickness TNLGW of the window area WA of the n-type optical guide layer NLG is less than a layer thickness TNLG1A of the area 1A (current constriction area) in the active area AC (TNLGW<TNLG1A).

For example, in the case where the n-type optical guide layer NLG is formed by crystal growth, a comparatively thick layer is formed over the n-type clad layer NCLD of the area 1A in the active area AC, and a comparatively thin layer is formed over the current block layer BL. On the other hand, in the window area WA in which the current block layer BL is not formed, a layer having a layer thickness between that of the thick layer and that of the thin layer is formed. As described above, in the window area WA in which the current block layer BL is not formed, the layer becomes relatively thinner than that between the current block layers BL in the active area AC in which the current block layer BL is formed. Furthermore, in the case where a layer containing Al is used as the current block layer BL, Al on the layer surface is easily oxidized, and thus a layer is less likely to grow thereover. Namely, the n-type optical guide layer NLG is not formed over the current block layer BL due to the selective growth effect, or even if formed, the layer becomes thin, and a comparatively thick layer is formed over the n-type clad layer NCLD in the area 1A between the current block layers BL. On the other hand, in the window area WA in which the current block layer BL is not formed, there is no difference in thickness between layers formed, and thus a layer having a layer thickness between those layer thicknesses is formed. Because of this, the relationship TNLGW<TNLG1A holds as described above (see FIG. 3). The layer thickness TNLG1A of the area 1A (current constriction area) of the n-type optical guide layer (n-type GaN layer) NLG is, for example, approximately 0.1 μm.

Note that, for example, silicon (Si) is used as the n-type impurities of the n-type substrate NS, the n-type clad layer NCLD, and the n-type optical guide layer NLG described above. Furthermore, the n-type optical guide layer NLG may be used as an undoped layer.

Moreover, the active layer MQW is arranged over the n-type optical guide layer NLG.

The active layer MQW is formed by, for example, a stacked layer obtained by alternately stacking a quantum well layer made of an indium gallium nitride layer (InGaN layer) and a barrier layer made of an indium gallium nitride layer (InGaN layer). The structure of such a stacked layer is referred to as a multi-quantum well structure. Then, the indium composition of the indium gallium nitride layer constituting the quantum well layer (InGaN well layer) differs from the indium composition of the indium gallium nitride layer constituting the barrier layer (InGaN barrier layer). The indium composition ratio between these layers, and the layer thickness, are adjusted in accordance with a desired oscillation wavelength.

In addition, the active layer MQW has the layer-thickness portions. The layer thickness TMQWW of the window area WA of the active layer MQW is less than the layer thickness TMQW1A of the area 1A (current constriction area) in the active area AC (TMQWW<TMQW1A, see FIG. 3).

For example, in the case where the active layer MQW is formed by crystal growth, a comparatively thick layer is formed over the n-type optical guide layer NLG of the area 1A in the active area AC, and a comparatively thin layer is formed over the current block layer BL. On the other hand, in the window area WA in which the current block layer BL is not formed, a layer having a layer thickness between that of the thick layer and that of the thin layer is formed. As described above, also in the active layer MQW, in the same way as in the n-type clad layer NCLD, the layer thickness becomes relatively smaller than the layer thickness between the current block layers BL in the active area AC in which the current block layer BL is formed, in the window area WA in which the current block layer BL is not formed. Furthermore, as described above, the n-type clad layer NCLD is not formed over the current block layer BL due to the selective growth effect, or even if formed, the layer becomes thin. Because of this, the active layer MQW is not formed over the current block layer BL, or even if formed, the layer becomes thin. On the other hand, in the window area WA in which the current block layer BL is not formed, there is no difference in thickness between the layers that are formed, and thus, a layer having a layer thickness between those layer thicknesses is formed. Therefore, the relationship TMQWW<TMQW1A holds as described above (see FIG. 3). The indium gallium nitride quantum well layer constituting the active layer MQW is, for example, an undoped $In_{0.1}Ga_{0.9}N$ layer having a layer thickness of approximately 3 nm to 10 nm and including approximately two or three layers. The indium gallium nitride layer constituting the barrier layer is an undoped $In_{0.01}Ga_{0.99}N$ layer and has a layer thickness of approximately 10 nm to 20 nm.

The p-type optical guide layer PLG is arranged over the active layer MQW.

A gallium nitride layer obtained by introducing p-type impurities (p-type GaN layer) is used as the p-type optical guide layer PLG. In the same way as the n-type optical guide layer NLG and the active layer MQW have, the p-type optical guide layer PLG may also have the layer-thickness portions. For example, a layer thickness TPLGW of the window area WA of the p-type optical guide layer PLG is smaller than a layer thickness TPLG1A of the area 1A (current constriction area) in the active area AC (TPLGW<TPLG1A, see FIG. 3).

For example, in the case where the p-type optical guide layer PLG is formed by crystal growth, a comparatively thick layer is formed over the active layer MQW of the area 1A in the active area AC, and a comparatively thin layer is formed over the current block layer BL. On the other hand, in the window area WA in which the current block layer BL is not formed, a layer having a layer thickness between that of the thick layer and that of the thin layer is formed. As described above, also in the p-type optical guide layer PLG, in the same way as in the n-type guide layer NLG and the active layer MQW, in the window area WA in which the current block layer BL is not formed, the layer thickness becomes relatively smaller than that between the current block layers BL in the active area AC in which the current block layer BL is formed. Furthermore, as described above, the active layer MQW is not formed over the current block layer BL, or even if formed, the layer becomes thin. Therefore, the p-type optical guide layer PLG is not formed over the current block layer BL, or even if formed, the layer becomes thin. On the other hand, in the window area WA in which the current block layer BL is not formed, there is no difference in thickness between the layers formed, and thus a layer having a layer thickness between those layer thicknesses is formed. Because of this, the relationship TPLGW<TPLG1A is generated as described above (see FIG. 3). The layer thickness TPLG1A of the area 1A (current constriction area) of the p-type optical guide layer PLG is, for example, approximately 0.1 μm.

In addition, the p-type clad layer PCLD is arranged over the p-type optical guide layer PLG.

For example, a superlattice layer in which an aluminum gallium nitride layer obtained by introducing p-type impurities (p-type AlGaN layer) and a gallium nitride layer obtained by introducing p-type impurities (p-type GaN layer) are alternately stacked is used as the p-type clad layer PCLD. The thickness of the p-type clad layer PCLD is, for example, approximately 0.5 μm. Note that there may be generated a difference in layer thickness between areas, also in the p-type clad layer PCLD in the same way as in the lower layers. However, the layer thickness of the p-type clad layer PCLD is greater than the layer thickness (e.g., 0.3 μm or less) of the lower layers (the p-type optical guide layer PLG, the active layer MQW, and the n-type optical guide layer NLG), and thus the difference in layer thickness is alleviated.

A gallium nitride layer obtained by introducing p-type impurities (p-type GaN layer) is used as the p-type contact layer PCNT. The thickness of the p-type GaN layer is, for example, approximately 0.02 μm.

For example, magnesium (Mg) is used as p-type impurities of the p-type optical guide layer PLG, the p-type clad layer PCLD, and the p-type contact layer PCNT described above. The p-type optical guide layer PLG may be formed as an undoped layer.

An aluminum gallium nitride layer obtained by introducing p-type impurities (p-type AlGaN layer) may be provided as a carrier confinement layer between the active layer MQW and the p-type optical guide layer PLG.

Here, the band gap of the active layer MQW is smaller than that of the n-type clad layer NCLD. Furthermore, the band gap of the active layer MQW is smaller than that of the p-type clad layer PCLD. More specifically, here, a stacked layer portion of a p-type nitride semiconductor is provided over the active layer MQW, and the band gap of the active layer MQW is smaller than that of each layer constituting the stacked layer portion of the p-type nitride semiconductor. In addition, a stacked layer portion of an n-type nitride semiconductor is provided under the active layer MQW, and the band gap of the active layer MQW is smaller than that of each layer constituting the stacked layer portion of the n-type nitride semiconductor. Furthermore, the refractive index of the stacked layer portion of the n-type nitride semiconductor and the stacked layer portion of the p-type nitride semiconductor is lower than that of the active layer MQW.

Then, the current block layer BL includes a nitride semiconductor containing Al, and the band gap of the current block layer BL is larger than that of any of the active layer MQW, the n-type clad layer NCLD, and the p-type clad layer PCLD. More specifically, the band gap of the current block layer BL is larger than that of any of the active layer MQW, the layer of the stacked layer portion of the p-type nitride semiconductor thereover, and the layer of the stacked layer portion of the n-type nitride semiconductor thereunder.

The width of the current constriction area (between the current block layers BL, the area 1A) is, for example, approximately 1 μm. It is possible to adjust the width (width in the Y-direction in FIG. 4), for example, in a range of 1 μm to 20 μm. In addition, the width of the current block layer BL (width in the Y-direction in FIG. 4) is not limited, but when the width is too narrow, the layer thickness difference due to the selective growth effect becomes small, and thus, it is preferable to adjust the width to substantially the same width as the width of the current constriction area or in a range wider than the current constriction area (e.g., in a range of 1 μm to 50 μm, preferably, in a range of 5 μm to 30 μm).

Furthermore, it is possible to adjust the width in the X-direction of the window area WA, in other words, the amount of retraction of the current block layer BL from the cleavage plane CP, for example, in a range of 2 μm to 50 μm, preferably, in a range of 5 μm to 20 μm.

Moreover, the outline of the rectangle of the semiconductor layer (chip area, see FIG. 4) has, for example, a long side of 600 μm to 1,000 μm long and a short side of 150 μm to 200 μm long.

The X-direction shown in FIG. 4 is the light emission direction, i.e., the <1-100> direction. Consequently, the current constriction area (area 1A) and the current block layer BL extend in the <1-100> direction.

The insulating layer IL is arranged over the p-type contact layer PCNT. For example, a silicon oxide film is used as the insulating layer IL. The insulating layer IL has the opening OA over the current constriction area (area 1A).

The p-type contact layer PCNT and the p-side electrode PEL are in contact with each other via the opening OA in the insulating layer (insulating film) IL.

As described above, according to the semiconductor laser of the present embodiment, the area (area 1A) between these layers forms the current constriction area by providing the two current block layers BL. It is also possible to confine the light in the horizontal direction by the current block layer BL.

Then, it is possible to make large the band gap of the active layer MQW in the window area WA, by forming the active layer MQW in the window area WA so as to be thinner than the active layer MQW in the current constriction area (area 1A). Therefore, it is possible to suppress end face destruction due to the catastrophic optical damage to the light emission end face.

Namely, the temperature may rise along with the absorption of light in the vicinity of the light emission end face of the semiconductor laser. When the temperature rises, the band gap of the semiconductor layer in the vicinity of the light emission end face becomes small and the amount of absorbed laser light increases. When such a vicious cycle of absorption of light –> rise in temperature –> further absorption of light –> further rise in temperature occurs, the end face destruction eventually occurs due to the catastrophic optical damage to the light emission end face and laser oscillation becomes longer possible.

In contrast to this, in the present embodiment, it is possible to make large the band gap of the active layer MQW in the window area WA, by forming the active layer MQW in the window area WA so as to be thinner than the active layer MQW in the current constriction area (area 1A) (TMQWW<TMQW1A). Therefore, it is possible to suppress the absorption of light in the vicinity of the light emission end face and to suppress the catastrophic optical damage to the light emission end face.

Furthermore, it is possible to make large the difference between the layer thickness over the current block layer BL and that in the current constriction area (area 1A) by using a substrate having an off-angle inclined in the <1-100> direction from the (0001) plane, and thus it is possible to form the active layer MQW in the window area WA so as to be thinner than the active layer MQW in the current constriction area (area 1A) because of the presence/absence of the current block layer BL. In this way, it is possible to form the active layer MQW in the window area WA so as to be thinner than the active layer MQW in the current constriction area (area 1A) by the substrate having an off-angle and the current block layer BL.

Furthermore, it is possible to confine the light in the horizontal direction by means of the current block layer BL by forming the area (area 1A) between the two current block layers BL as the current constriction area, and thus it is not necessary to form a ridge structure and the process of forming a ridge structure (patterning process of the p-type contact layer PCNT and the p-type clad layer PCLD) is no longer required. In addition, the p-type clad layer PCLD is formed in a wide area, and thus heat dissipation in the horizontal direction becomes favorable. Furthermore, it is possible to secure a large connection area between the p-type contact layer PCNT and the p-side electrode PEL, and thus it is possible to reduce the connection resistance. Then, because of the above, it is possible to reduce the operation voltage of the semiconductor laser.

[Explanation of Manufacturing Method]

Next, the manufacturing method of the semiconductor laser of the present embodiment will be explained with reference to FIG. 6 to FIG. 32, and at the same time, the configuration of the semiconductor laser will be made clearer. FIG. 6 to FIG. 32 (except for FIG. 17) are cross-sectional views or plan views showing the manufacturing process of the semiconductor laser of the present embodiment.

As shown in FIG. 6, as the n-type substrate NS, for example, a substrate including gallium nitride (GaN) obtained by introducing n-type impurities, and having an off-angle in the <1-100> direction from the (0001) plane is prepared (see FIG. 5). The off-angle θ is, for example, approximately 0.1° to 3°, and preferably, approximately 0.2° to 1°. Note that it is possible to use a free-standing substrate as the n-type substrate NS. The free-standing substrate is a substrate formed by growing gallium nitride over a supporting substrate such as a silicon carbide substrate or a sapphire substrate, and then, removing the supporting substrate to thereby leave gallium nitride alone.

Subsequently, as shown in FIG. 7, an n-type AlGaN layer is formed as the n-type clad layer NCLD, over the n-type substrate NS. For example, through the use of the MOVPE (Metal Organic Vapor Phase Epitaxy) device, the n-type clad layer NCLD (n-type AlGaN layer) is crystal-grown while introducing a carrier gas and raw material gases into the device. Hydrogen, nitrogen, or a mixed gas of hydrogen and nitrogen is used as the carrier gas. A gas containing a constituent element of the nitride semiconductor is used as the raw material gas. For example, in forming the n-type clad layer NCLD (n-type AlGaN layer), TMAl (trimethyl aluminum), TMGa (trimethyl gallium), and $NH_3$ (ammonia) are respectively used as raw materials of the Al, Ga, and N, and $SiH_4$ (silane) is used as a raw material of the n-type impurities. The n-type substrate NS is set over the device, the temperature of the substrate is increased while supplying $NH_3$, and after the growth temperature is reached, the n-type clad layer NCLD (n-type AlGaN layer) having a thickness of approximately 2 μm is crystal-grown while introducing the raw material gases into the device along with the carrier gas. The growth temperature is, for example, approximately 1,000° C. to 1,100° C.

Then, as shown in FIG. 8, the temperature within the device is reduced and the current block layer BL (AlN layer) having a thickness of approximately 0.1 μm is grown at temperatures lower than the growth temperature of the n-type clad layer NCLD. In forming the current block layer BL (AlN layer), TMAl (trimethyl aluminum) and $NH_3$ (ammonia) are respectively used as raw materials of Al and N. The growth temperature is, for example, approximately 200° C. to 600° C. It is possible to form the current block layer BL (AlN layer) in an amorphous state, by forming the layer at comparatively low temperatures (e.g., temperatures lower than the growth temperature of the n-type clad layer NCLD and the active layer MQW, to be described later).

After that, the substrate is taken out of the MOVPE device and the current block layer BL (AlN layer) is patterned as shown in FIG. 9 to FIG. 12. For example, a hard mask (not shown) is formed over the current block layer BL (AlN layer). For example, a silicon oxide film is formed over the current block layer BL (AlN layer) by using the CVD (Chemical Vapor Deposition) method or the like. Next, after applying a photoresist film over the silicon oxide film, the photoresist film is caused to remain only in the area in which the current block layer BL (AlN layer) is caused to remain by using the photolithography technique. Subsequently, the hard mask (silicon oxide film) is etched by using the photoresist film as a mask. Then, the photoresist film is removed by asking or the like. Next, the current block layer BL (AlN layer) is etched by using the hard mask (silicon oxide film) as a mask. Either the dry etching method or the wet etching method may be used as the etching method. As described above, it is possible to easily perform etching, by forming the current block layer BL (AlN layer) at comparatively low temperatures to thereby form the current block layer BL (AlN layer) in an amorphous state, even in the case of using the wet etching method. After that, the hard mask (silicon oxide film) is removed. The current block layer BL (AlN layer) in an amorphous state crystallizes due to thermal load in the subsequent processing.

The two current block layers BL are formed in the active area AC by the above-described etching. The planar shape of the current block layer BL when viewed from the upper face is, for example, a rectangle (quadrangle) (FIG. 12). In addition, the current block layer BL has its long side in the <1-100> direction. The two current block layers BL are formed with a predetermined interval (e.g., about 1 µm to 20 µm). In other words, the current block layer BL is formed on both sides of the area 1A shown in FIG. 12. The area (area 1A) between the current block layers BL serves as the current constriction area. The area 1A has the shape of a rectangle having its long side in the X-direction.

Furthermore, the current block layer BL does not extend as far as the end part of the chip area (semiconductor laser formation area). In other words, the current block layer BL is arranged so as to be retracted from the chip area (the side extending in the Y-direction in the semiconductor laser formation area). Because of this, in the area having a predetermined width from the side (cleavage plane CL, end face) extending in the Y-direction, the current block layer BL is not formed. This area forms the window area WA. The width in the X-direction of the window area WA is, for example, approximately 2 µm to 50 µm, preferably, approximately 5 µm to 20 µm.

Next, as shown in FIG. 13 to FIG. 16, an n-type GaN layer is formed as the n-type optical guide layer NLG, over the current block layer BL (AlN layer) and the n-type clad layer NCLD (n-type AlGaN layer). For example, the n-type optical guide layer NLG (n-type GaN layer) is crystal-grown while introducing a carrier gas and raw material gases into the device. As the raw material gases, TMGa (trimethyl gallium) and NH$_3$ (ammonia) are respectively used as raw materials of Ga and N, and SiH$_4$ (silane) is used as a raw material of n-type impurities. The growth temperature is, for example, approximately 1,000° C. to 1,100° C.

Figure 17:
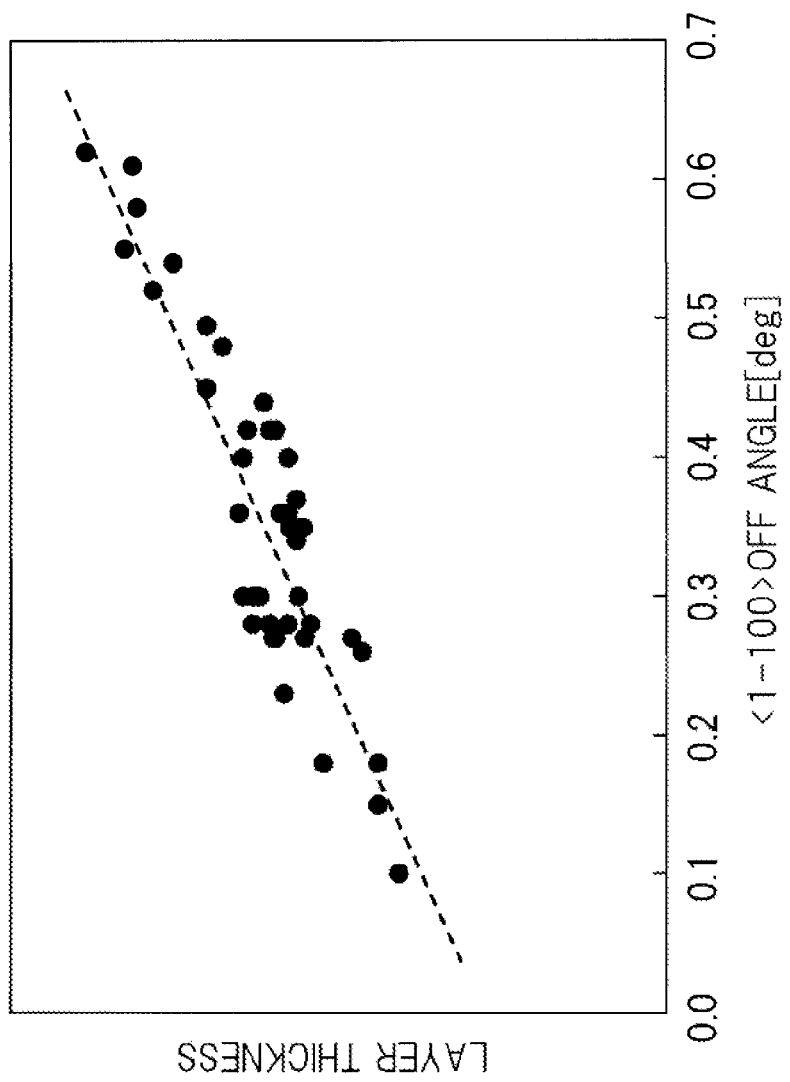
FIG. 17 is a diagram showing a relationship between the layer thickness of a layer formed over an n-type clad layer between current block layers BL (area 1A) and the off-angle.
Figure 18:
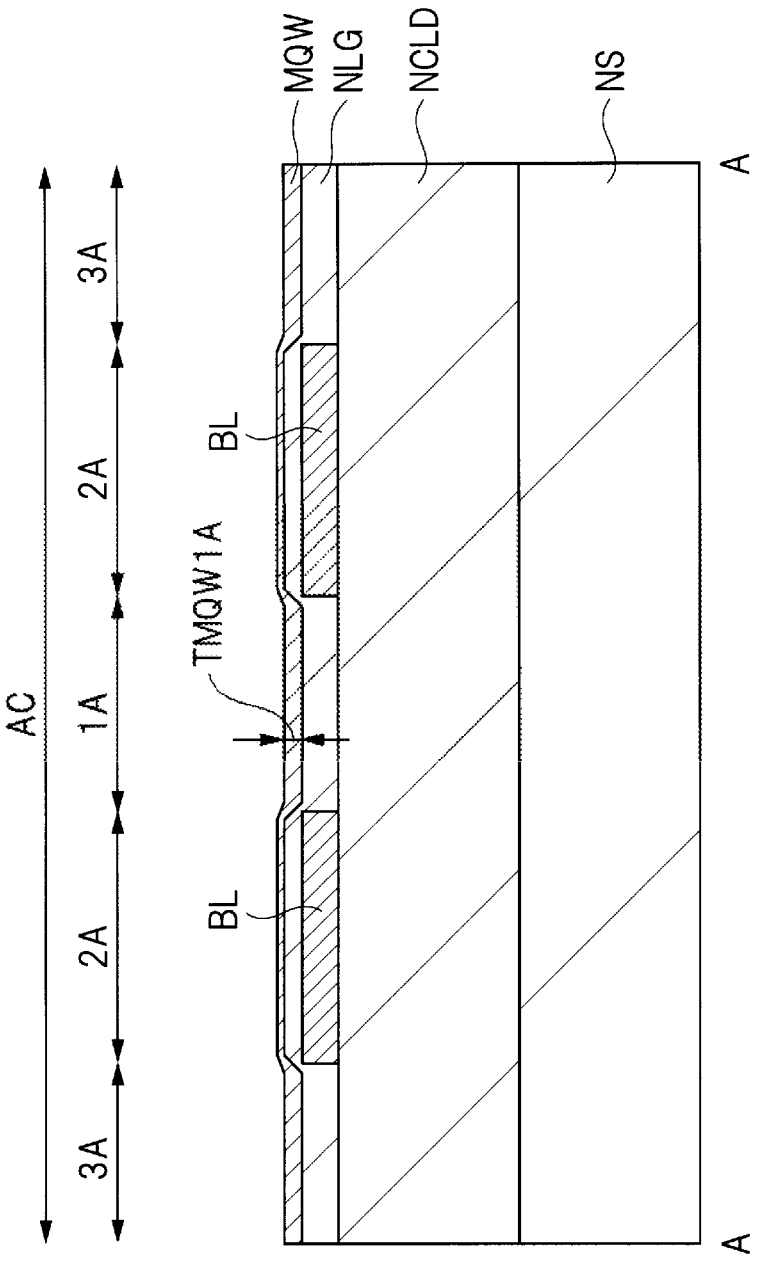
FIG. 18 is a cross-sectional view showing the manufacturing process of the semiconductor laser of the first embodiment, a cross-sectional view showing the manufacturing process that follows FIG. 13.
Figure 19:
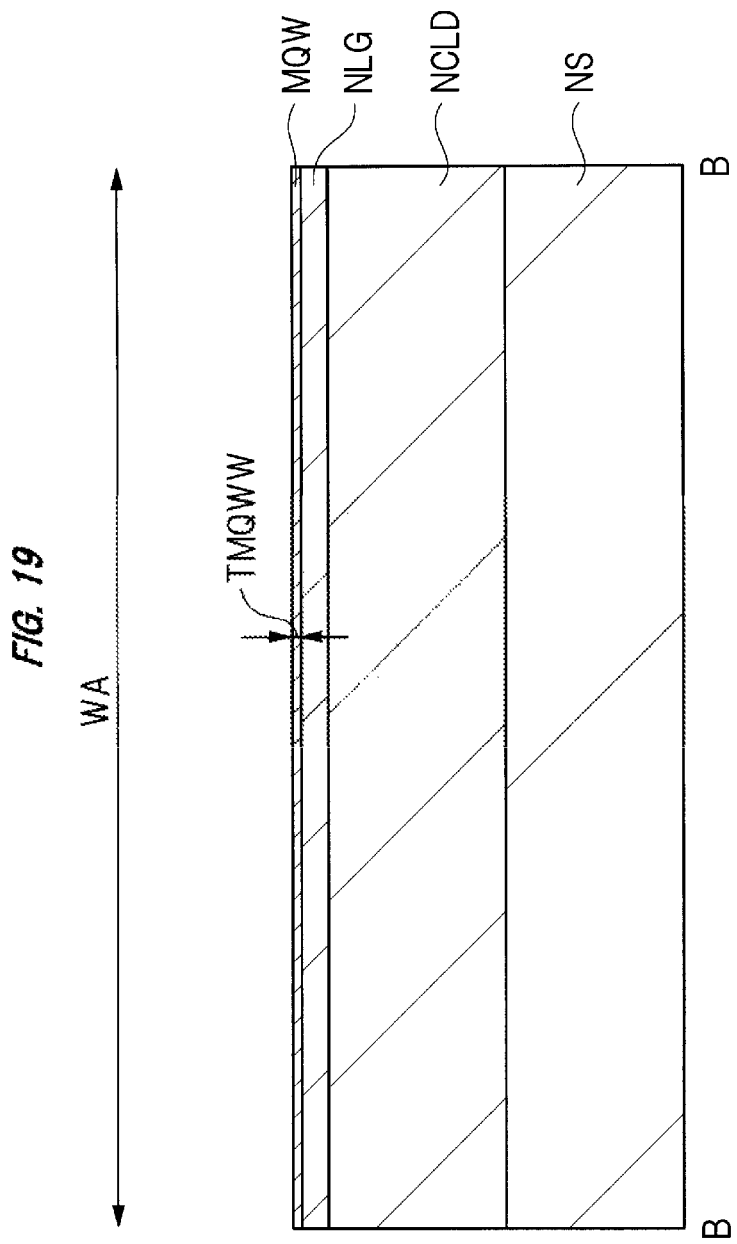
FIG. 19 is a cross-sectional view showing the manufacturing process of the semiconductor laser of the first embodiment, a cross-sectional view showing the manufacturing process that follows FIG. 14.
Figure 20:
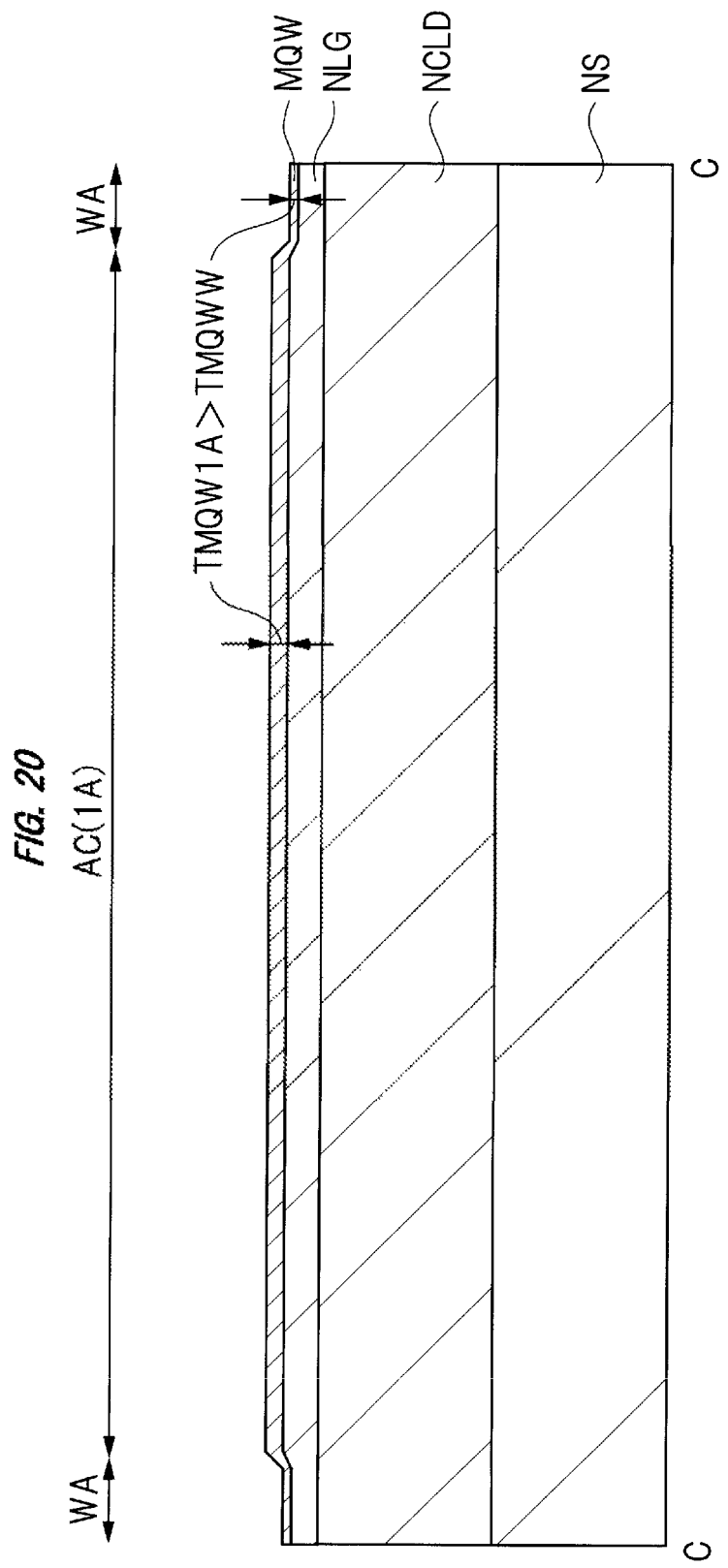
FIG. 20 is a cross-sectional view showing the manufacturing process of the semiconductor laser of the first embodiment, a cross-sectional view showing the manufacturing process that follows FIG. 15.
Figure 21:
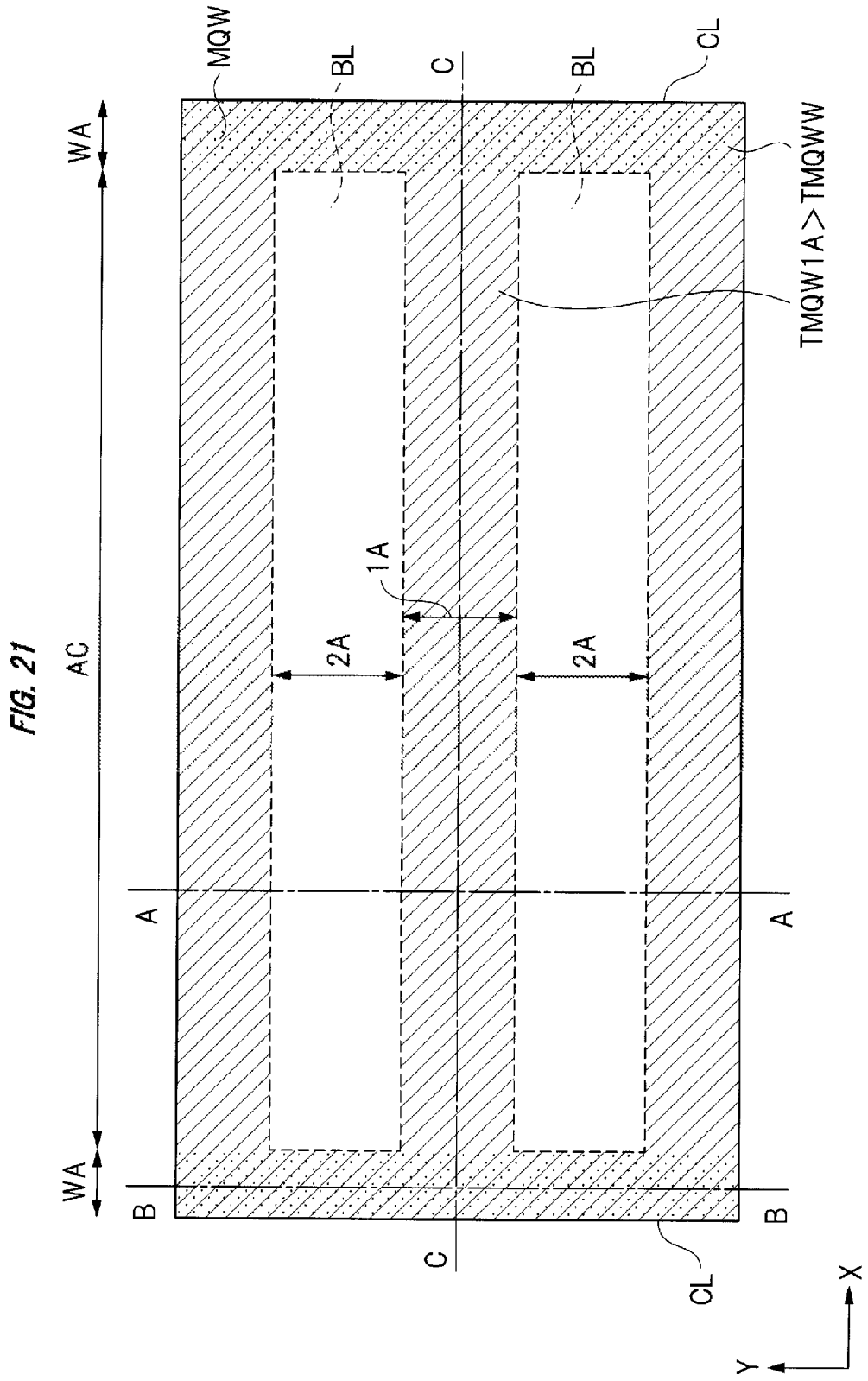
FIG. 21 is plan view showing the manufacturing process of the semiconductor laser of the first embodiment.
Figure 22:
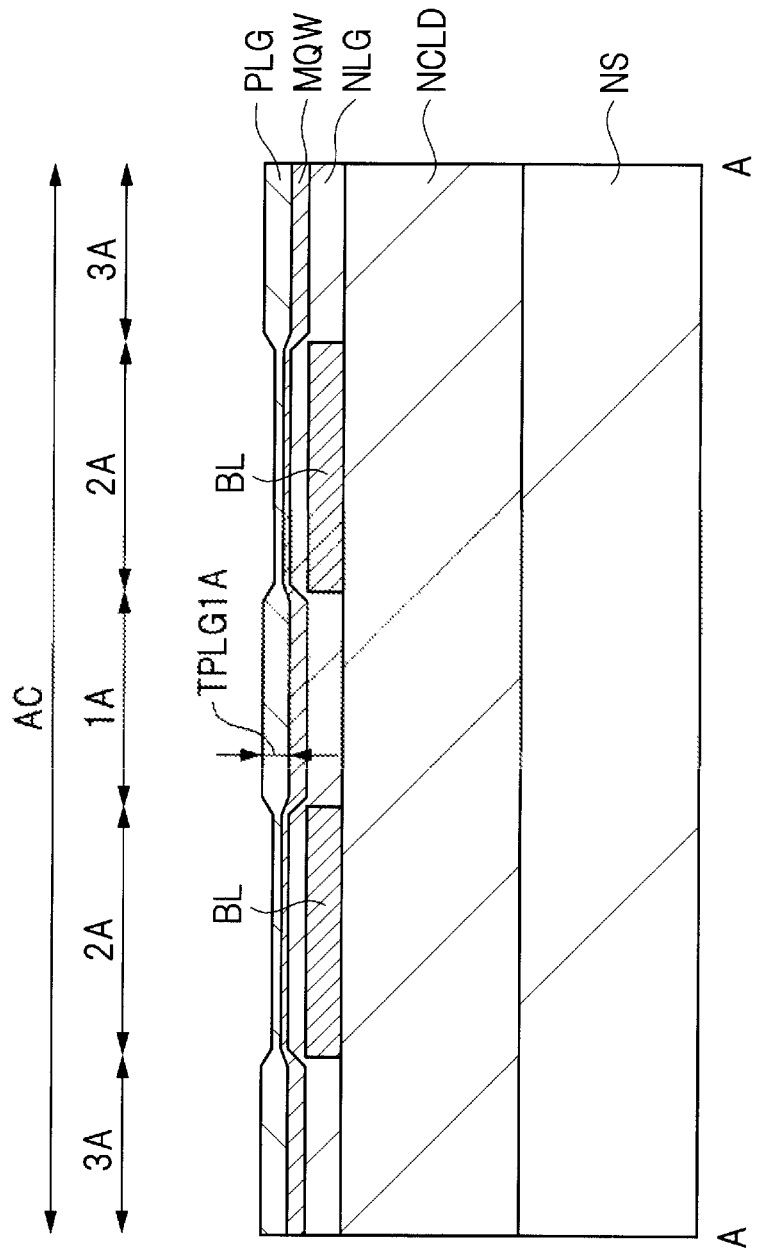
FIG. 22 is a cross-sectional view showing the manufacturing process of the semiconductor laser of the first embodiment, a cross-sectional view showing the manufacturing process that follows FIG. 18.
Figure 23:
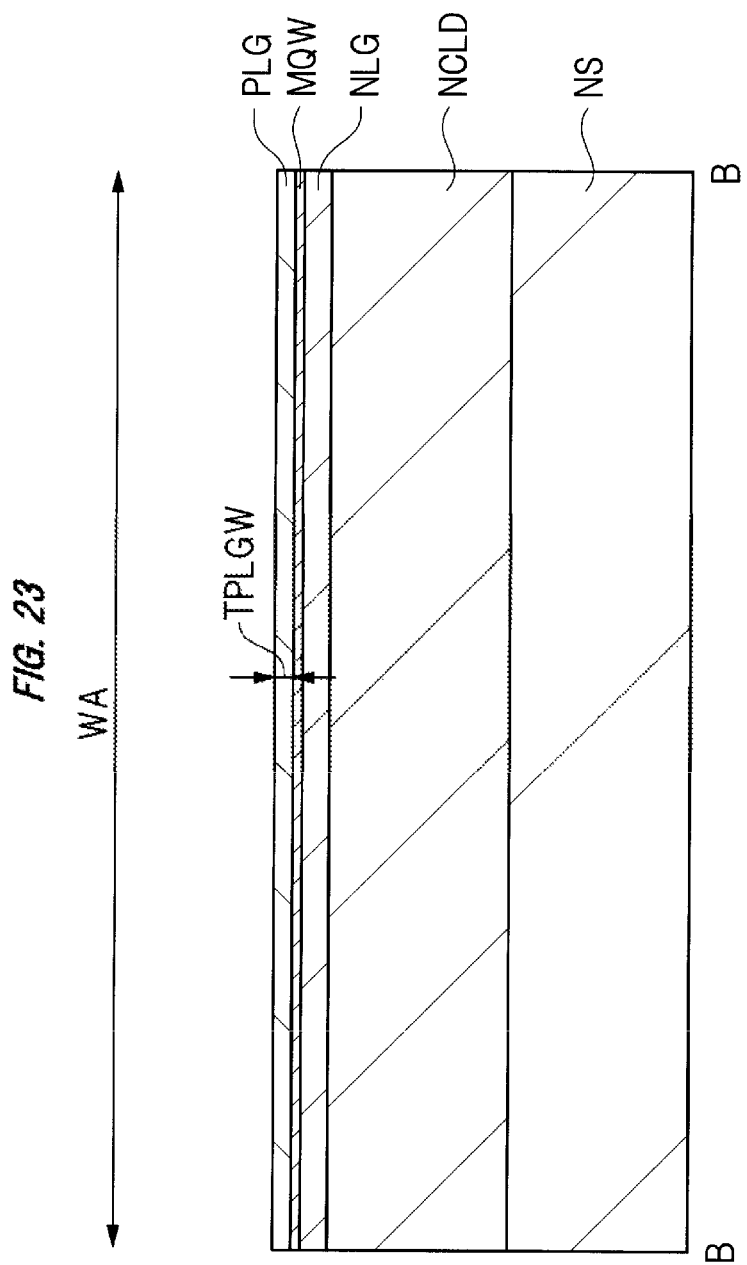
FIG. 23 is a cross-sectional view showing the manufacturing process of the semiconductor laser of the first embodiment, a cross-sectional view showing the manufacturing process that follows FIG. 19.
Figure 24:
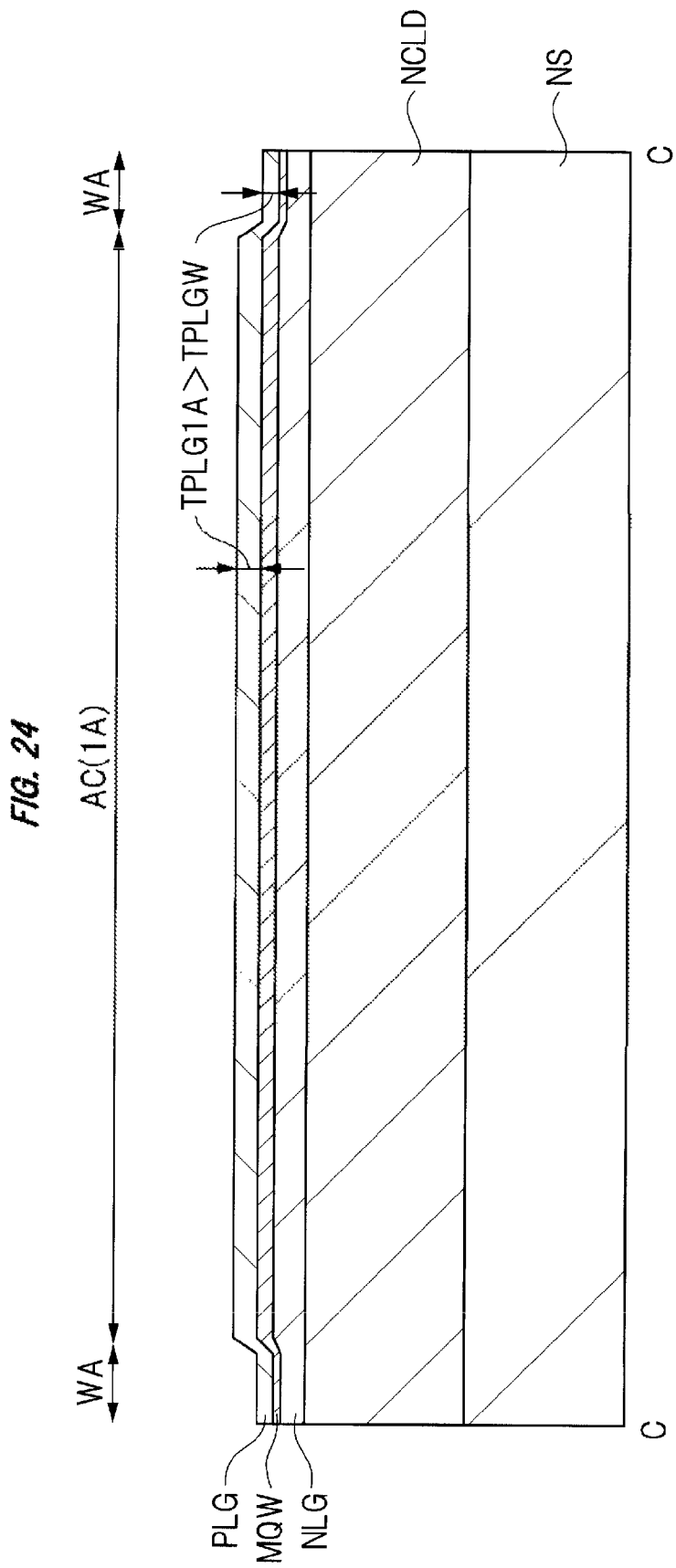
FIG. 24 is a cross-sectional view showing the manufacturing process of the semiconductor laser of the first embodiment, a cross-sectional view showing the manufacturing process that follows FIG. 20.
Figure 25:
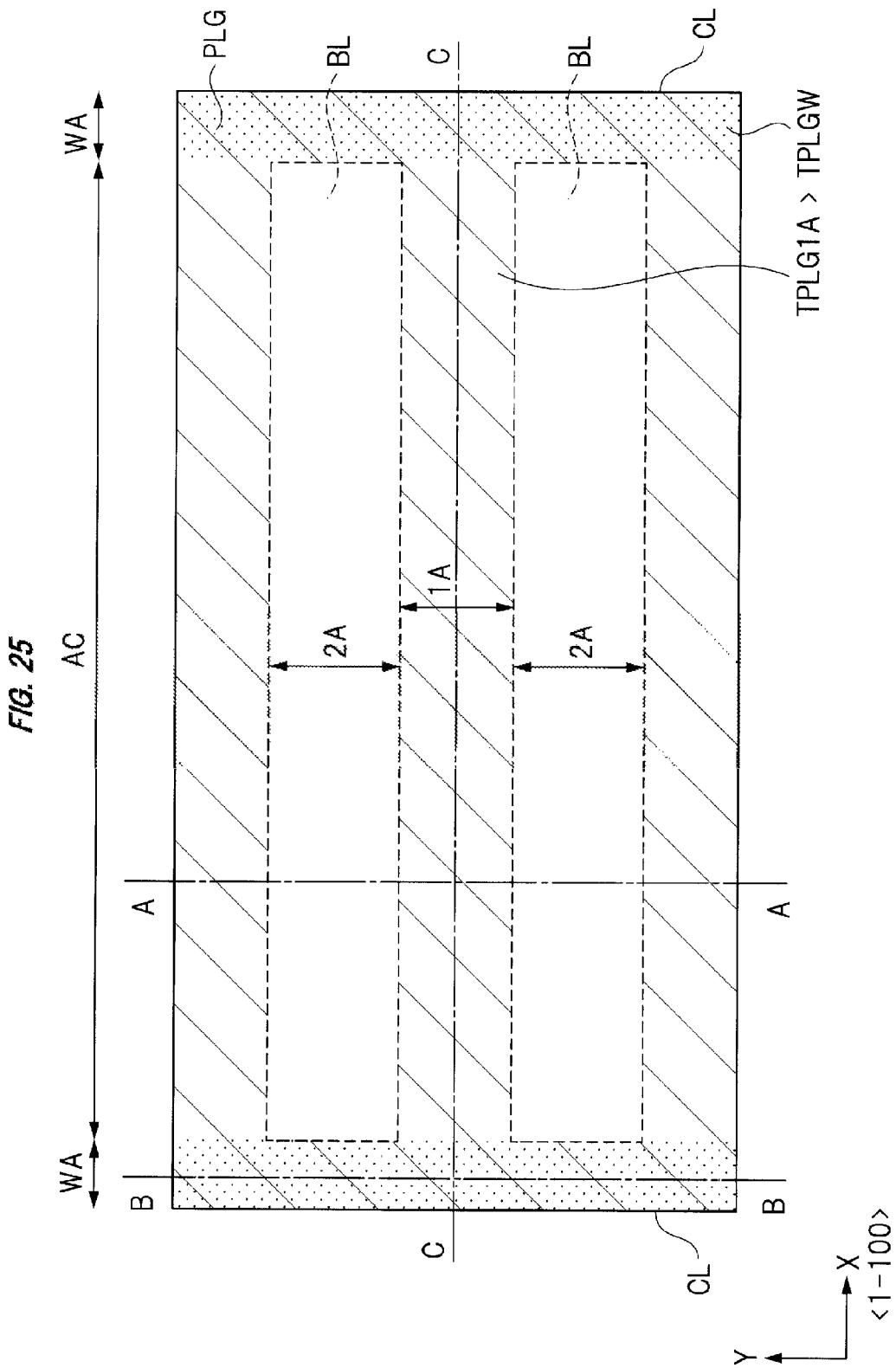
FIG. 25 is a plan view showing the manufacturing process of the semiconductor layer of the first embodiment.

FIG. 17 is a diagram showing a relationship between the layer thickness of the layer formed over the n-type clad layer between the current block layers BL and the off-angle. The vertical axis represents the layer thickness of the layer formed between the current block layers BL and the horizontal axis represents the inclination angle (off-angle) [deg] in the <1-100> direction. As shown in FIG. 17, the greater the off-angle becomes, the greater the selective growth effect becomes, and the thickness of the layer formed between the current block layers BL (area 1A) increases.

On the other hand, in the window area WA, the current block layer BL is not formed, and thus the n-type optical guide layer NLG thinner than the n-type optical guide layer NLG between the current block layers BL is formed. Furthermore, in the case where a layer containing Al such as an AlN layer is used as the current block layer BL, Al on the layer surface is easily oxidized and a layer is less likely grow over the surface, and thus the n-type clad layer NCLD is not formed over the current block layer BL, or even if formed, the layer becomes thin. Therefore, with respect to the layer thickness of the n-type optical guide layer NLG, the relationship TNLG1A>TNLGW holds for the layer thickness TNLG1A of the area 1A and the layer thickness TNLGW of the window area WA (see FIG. 13 to FIG. 16). In more detail, with respect to the layer thickness of the n-type optical guide layer NLG, the relationship TNLG1A>TNLGW>TNLG2A holds for the layer thickness TNLG1A of the area 1A, the layer thickness of the area 2A (here, denoted by TNLG2A), and the layer thickness TNLGW of the window area WA. The layer thickness of the n-type optical guide layer NLG (n-type GaN layer) is, for example, approximately 0.1 µm in the area 1A.

Next, as shown in FIG. 18 to FIG. 21, the raw material gases are switched and, the active layer MQW (multi-quantum well structure in which an InGaN well layer and an InGaN barrier layer each having different indium compositions are alternately stacked) is crystal-grown over the n-type optical guide layer NLG. In forming the active layer MQW (InGaN well layer and InGaN barrier layer), TMIn (trimethyl indium), TMGa (trimethyl gallium), and NH$_3$ (ammonia) are respectively used as raw materials of In, Ga, and N. By switching the flow rates of TMIn (trimethyl indium), which is a raw material of In, it is possible to alternately stack the InGaN well layer and the InGaN barrier layer having different indium compositions. The growth temperature is, for example, approximately 800° C. to 900° C.

Also in the active layer MQW, in the same way as in the n-type optical guide layer NLG, the thickness of the layer formed between the current block layers BL (area 1A) is becomes large. Furthermore, the current block layer is not formed in the window area WA, and thus the active layer MQW thinner than the active layer MQW between the current block layers BL (area 1A) is formed. Moreover, the active layer MQW is not formed over the current block layer BL or over the thin n-type clad layer NCLD thereover, or even if formed, the layer becomes thin. Therefore, as to the layer thickness of the active layer MQW, the relationship TMQW1A>TMQWW is generated between the layer thickness TMQW1A of the area 1A and the layer thickness TMQWW of the window area WA (see FIG. 18 to FIG. 21). In more detail, as to the layer thickness of the active layer MQW, the relationship TMQW1>TMQWW>TMQW2A is generated among the layer thickness TMQW1A of the area 1A, the layer thickness of the area 2A (here, referred to as TMQW2A), and the layer thickness TMQWW of the window area WA.

In area 1A, the InGaN well layer constituting the active layer MQW is approximately 3 nm to 10 nm thick and includes approximately two or three layers, and the InGaN barrier layer is stacked having a thickness of approximately 10 nm to 20 nm.

Next, as shown in FIG. 22 to FIG. 25, the raw material gases are switched and the p-type optical guide layer PLG (p-type GaN layer) is crystal-grown over the active layer MQW. In forming the p-type optical guide layer PLG (p-type GaN layer), TMGa (trimethyl gallium) and NH$_3$ (ammonia) are respectively used as raw materials of Ga and N, and Cp$_2$Mg (bis(cyclopentadienyl)magnesium) is used as a raw material of p-type impurities. The growth temperature is, for example, approximately 1,000° C. to 1,100° C.

Also in the p-type optical guide layer PLG (p-type GaN layer), the layer-thickness portions may be formed in the same way as in the active layer MQW and the n-type optical guide layer NLG. For example, as to the layer thickness TPLG1A of the area 1A and the layer thickness TPLGW of the window area WA, the relationship TPLG1A >TPLGW may be generated (see FIG. 22 to FIG. 25). In more detail, as to the layer thickness TPLG1A of the area 1A, the layer thickness of the area 2A (here, referred to as TPLG2A), and the layer thickness TPLGW of the window area WA, the relationship TPLG1A>TPLGW>TPLG2A may be generated.

Note that, in the present embodiment, the difference in the layer thickness between the area between the current block layers BL (area 1A) and the active layer MQW in the window area WA is important and in the layers higher than the active layer MQW, the occurrence of the layer thickness difference between areas is not necessarily required and the layer thickness difference may be reduced. In the area 1A, the layer thickness of the p-type optical guide layer PLG (p-type GaN layer) is, for example, approximately 0.1 μm.

Figure 26:
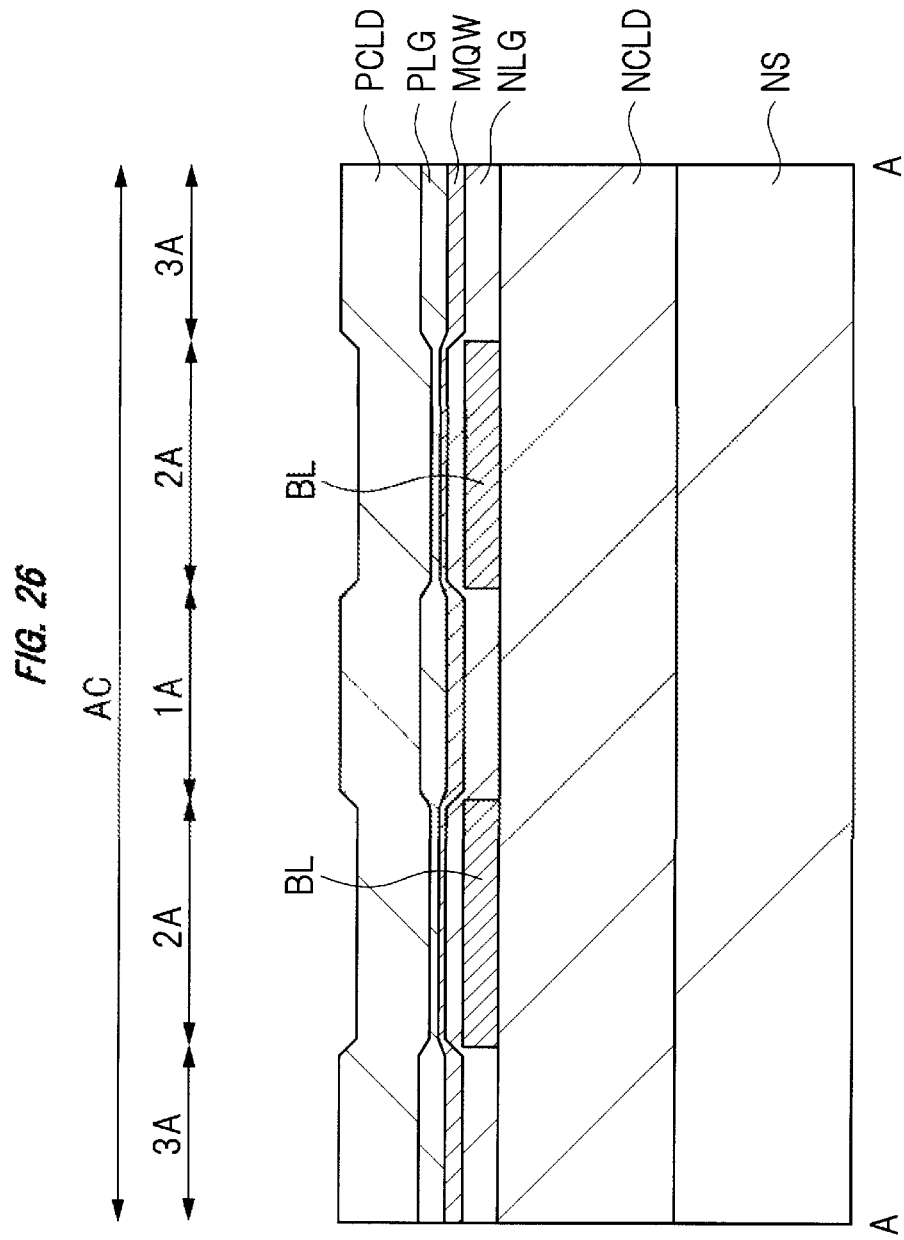
FIG. 26 is a cross-sectional view showing the manufacturing process of the semiconductor laser of the first embodiment, a cross-sectional view showing the manufacturing process that follows FIG. 22.
Figure 27:
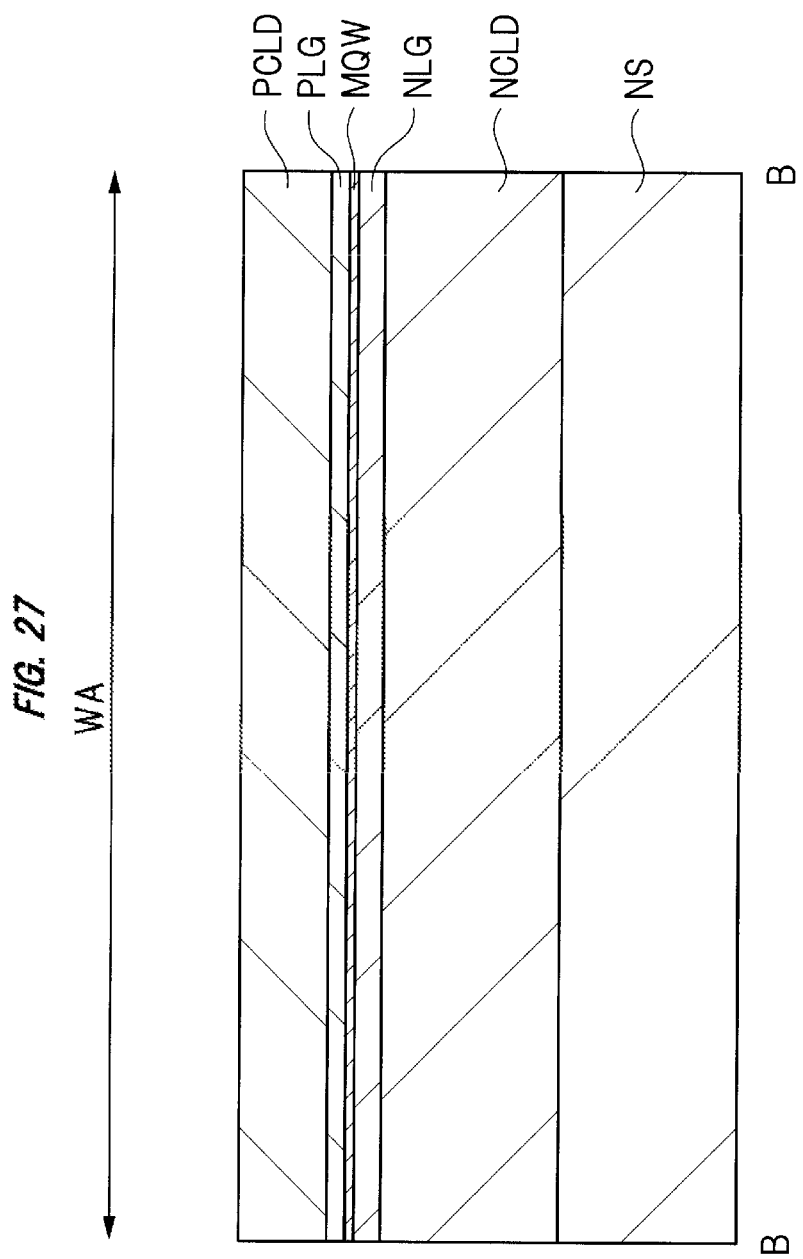
FIG. 27 is a cross-sectional view showing the manufacturing process of the semiconductor laser of the first embodiment, a cross-sectional view showing the manufacturing process that follows FIG. 23.
Figure 28:
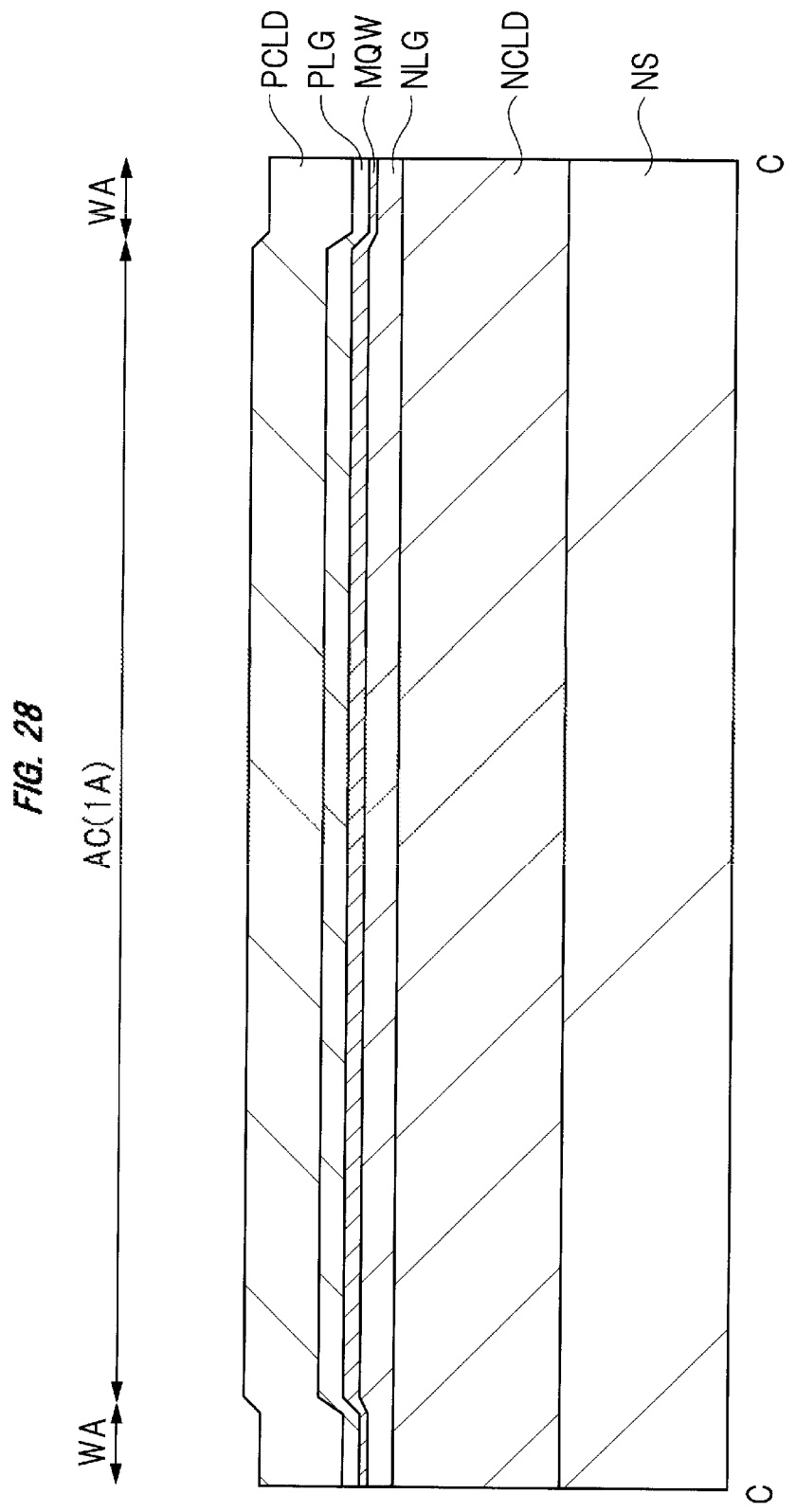
FIG. 28 is a cross-sectional view showing the manufacturing process of the semiconductor laser of the first embodiment, a cross-sectional view showing the manufacturing process that follows FIG. 24.

Next, as shown in FIG. 26 to FIG. 28, the raw material gases are switched and the p-type clad layer PCLD is crystal-grown over the p-type optical guide layer PLG. As the p-type clad layer PCLD, for example, a superlattice layer in which an aluminum gallium nitride layer (p-type AlGaN layer) obtained by introducing p-type impurities and a gallium nitride layer (p-type GaN layer) obtained by introducing p-type impurities are alternately stacked is formed over the p-type optical guide layer PLG (p-type GaN layer). In forming the p-type AlGaN layer, TMAl (trimethyl aluminum), TMGa (trimethyl gallium), and $NH_3$ (ammonia) are respectively used as raw materials of Al, Ga, and N, and $Cp_2Mg$ (bis(cyclopentadienyl)magnesium) is used as a raw material of p-type impurities. In forming the p-type GaN layer, the supply of TMAl (trimethyl aluminum) among the above-described raw material gases is stopped. In this way, by repeating the supply and the stop of supply of TMAl (trimethyl aluminum), which is a raw material of Al among the raw material gases, it is possible to form the p-type clad layer PCLD including the superlattice layer in which the p-type AlGaN layer and the p-type GaN layer are alternately stacked. The growth temperature is, for example, approximately 1,000° C. to 1,100° C. Note that, also in the p-type clad layer PCLD, the layer thickness difference may be generated between areas in the same way as in the lower layers, but here, the layer thickness of the p-type clad layer PCLD is larger than that of the p-type optical guide layer PLG, the active layer MQW, and the n-type optical guide layer NLG in the lower layers, and the layer thickness difference is reduced.

Figure 29:
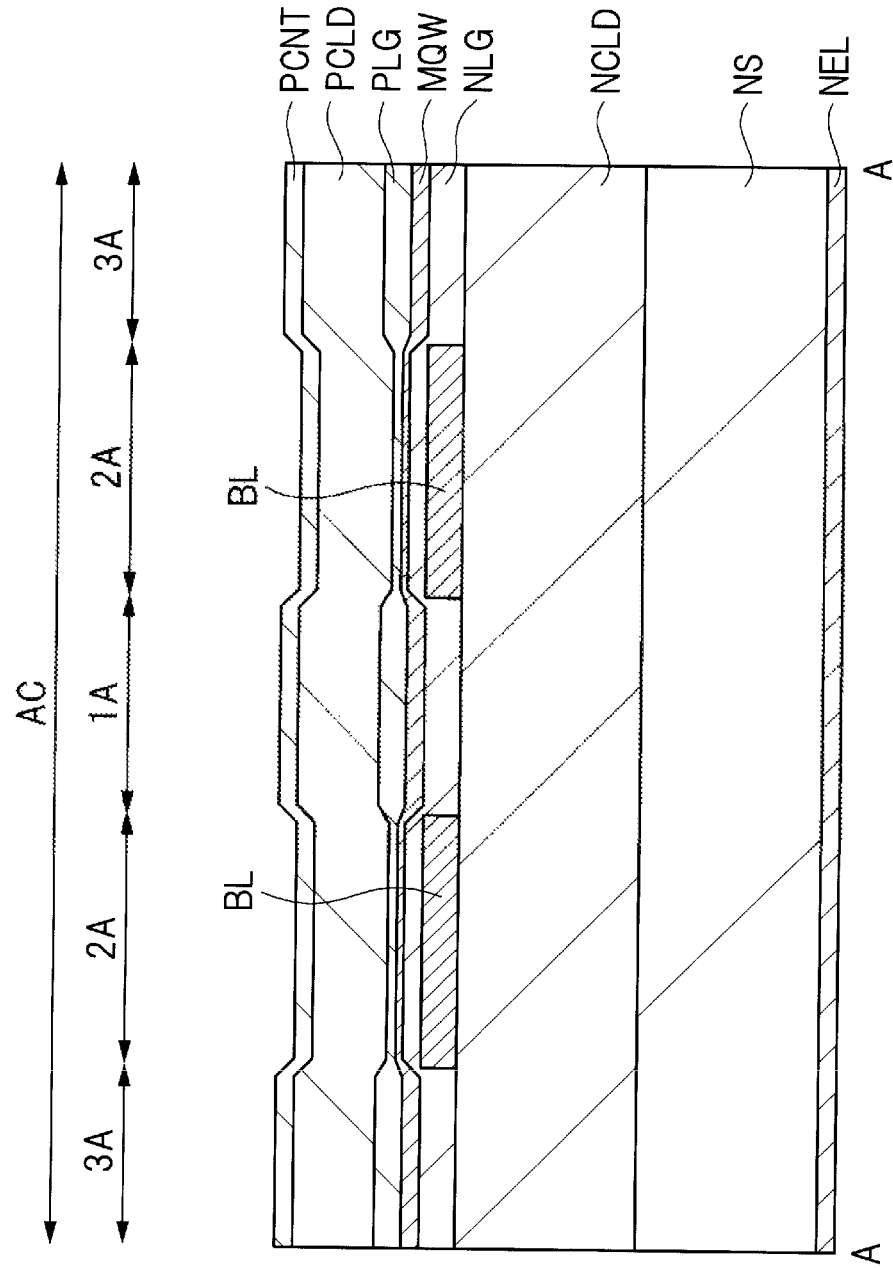
FIG. 29 is a cross-sectional view showing the manufacturing process of the semiconductor laser of the first embodiment, a cross-sectional view showing the manufacturing process that follows FIG. 26.

Then, as shown in FIG. 29, the raw material gases are switched and the p-type contact layer PCNT (p-type GaN layer) is crystal-grown over the p-type clad layer PCLD. In forming the p-type contact layer PCNT (p-type GaN layer), TMGa (trimethyl gallium) and $NH_3$ (ammonia) are respectively used as raw materials of Ga and N, and $Cp_2Mg$ (bis (cyclopentadienyl)magnesium) is used as a raw material of p-type impurities. The growth temperature is, for example, approximately 1,000° C. to 1,100° C.

Figure 30:
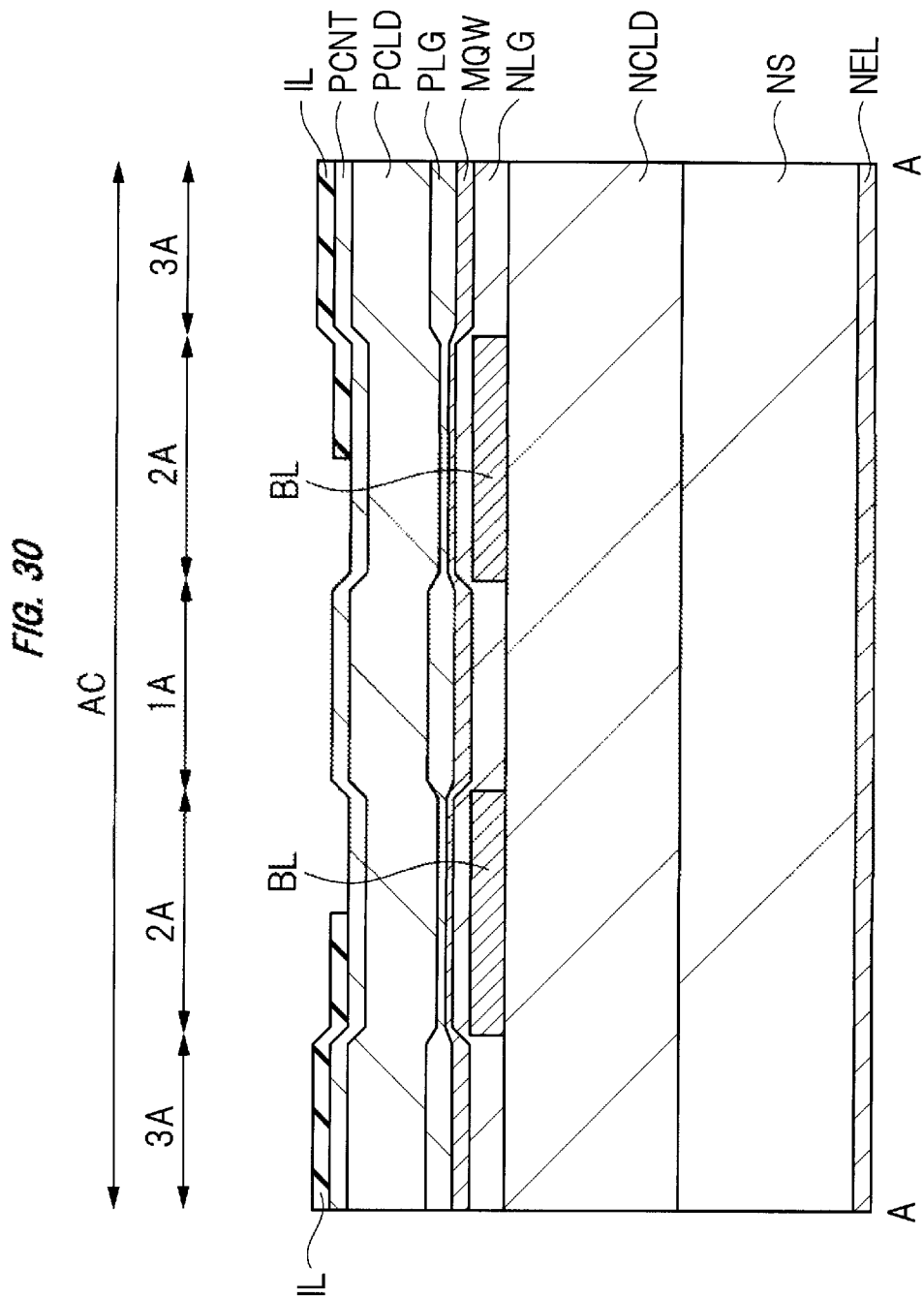
FIG. 30 is a cross-sectional view showing the manufacturing process of the semiconductor laser of the first embodiment, a cross-sectional view showing the manufacturing process that follows FIG. 29.
Figure 31:
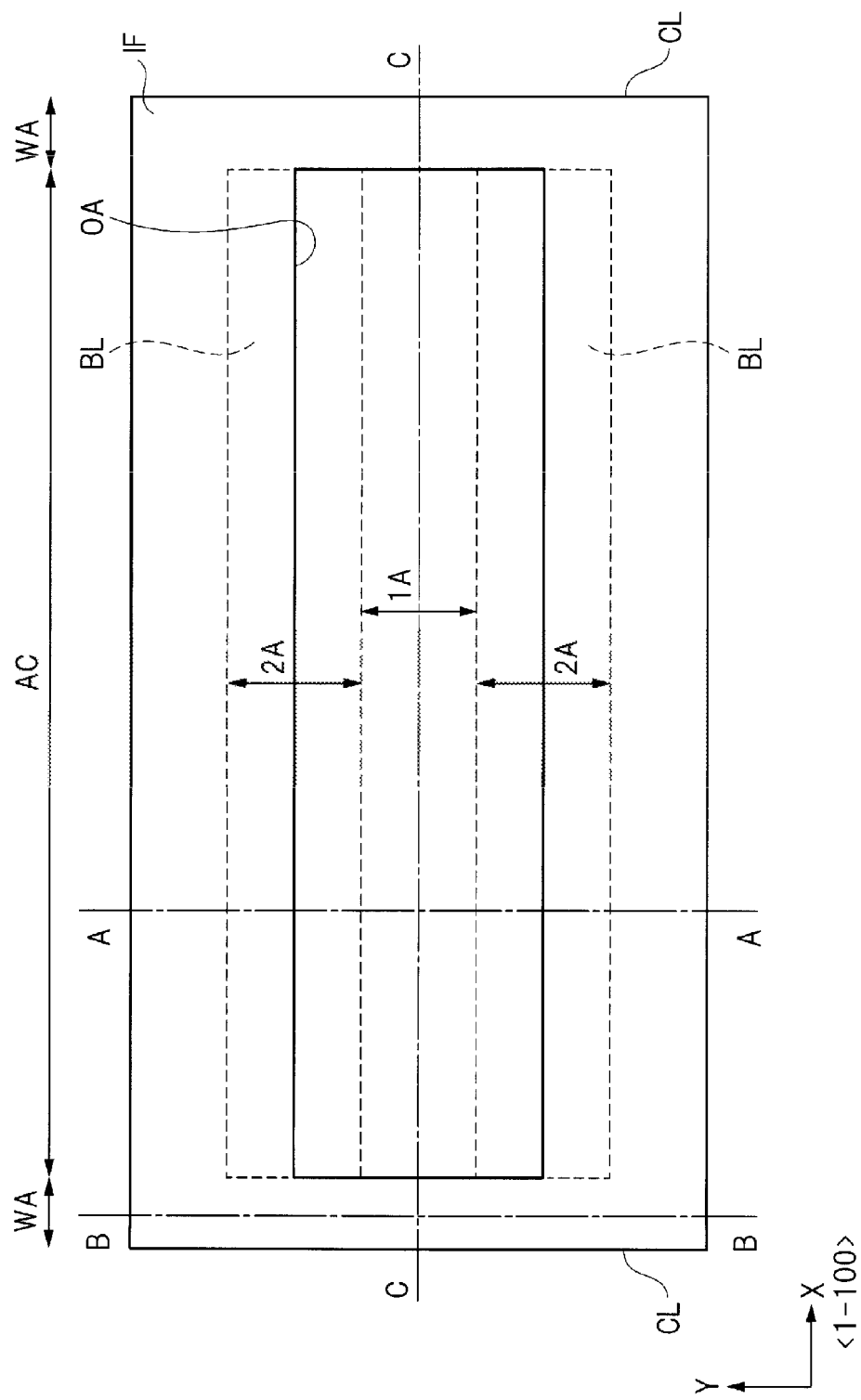
FIG. 31 is a plan view showing the manufacturing process of the semiconductor laser of the first embodiment.

Next, as shown in FIG. 30 and FIG. 31, for example, a silicon oxide film is formed over the p-type contact layer PCNT as the insulating layer IL by using the CVD method or the like. Subsequently, the insulating layer IL over the area 1A (current constriction area) is removed. For example, the insulating layer IL is etched by using a photoresist film (not shown) having an opening in the area 1A (current constriction area) as a mask. Then, the photoresist film is removed by asking or the like. Therefore, the insulating layer IL over the area 1A (current constriction area) is removed and the opening OA is formed. The p-type contact layer PCNT is exposed at the bottom surface of the opening OA.

Figure 32:
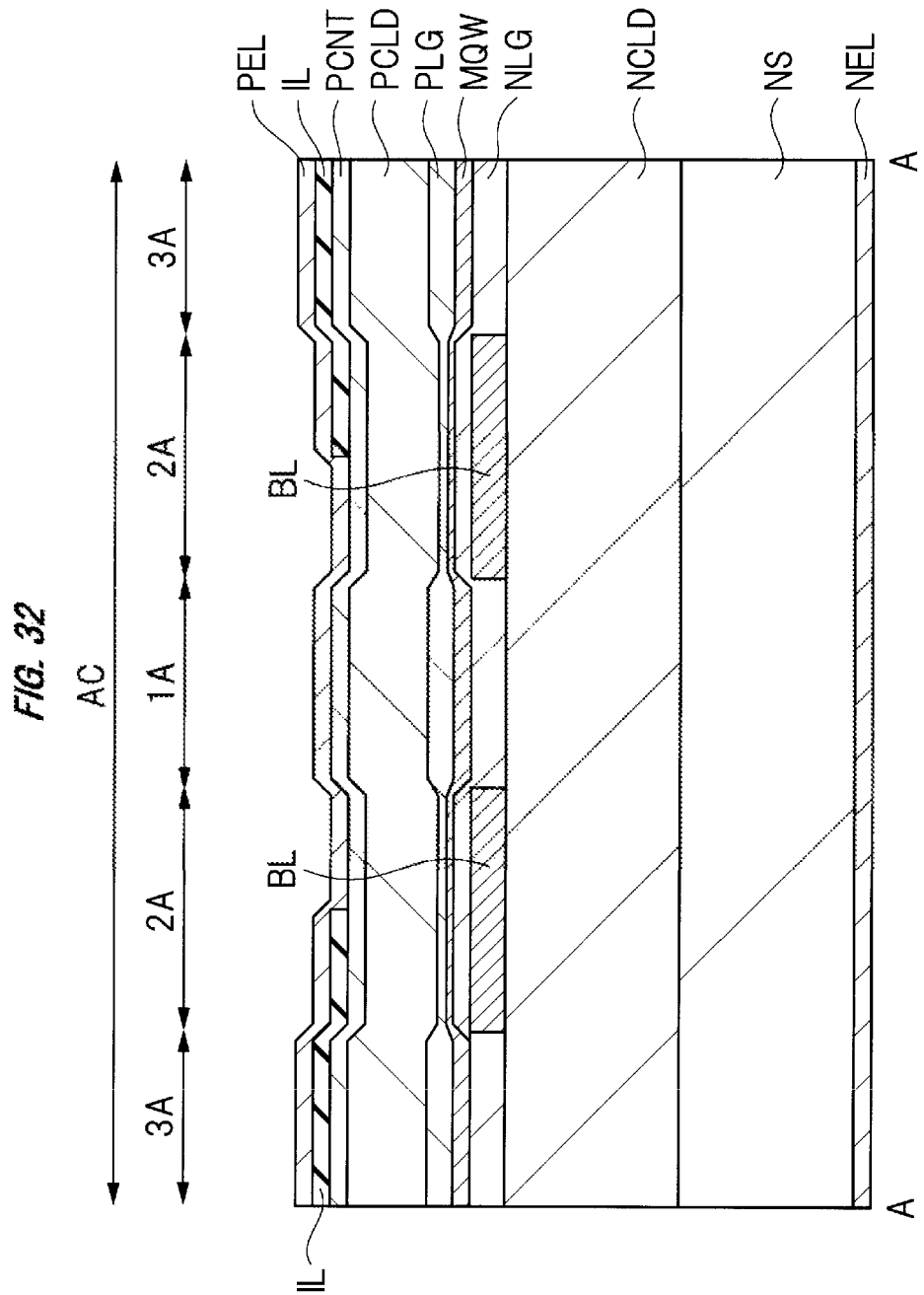
FIG. 32 is a cross-sectional view showing the manufacturing process of the semiconductor laser of the first embodiment, a cross-sectional view showing the manufacturing process that follows FIG. 30.

Subsequently, as shown in FIG. 32, the p-side electrode PEL is formed over the p-type contact layer PCNT and the insulating layer IL.

Then, the backside of the n-type substrate NS is set to be the upper face and the n-type substrate NS is made thin by grinding the backside of the n-type substrate NS. For example, the n-type substrate NS is made having a thickness of approximately 100 μm. Next, the n-side electrode NEL is formed at the backside of the n-type substrate NS (FIG. 32).

After that, the n-type substrate NS having a plurality of chip areas is cut out for each chip area. First, the chip areas are cleaved. Namely, the window area WA located between a certain chip area and the adjacent chip area is cleaved along the line CL (see FIG. 31). The cleavage plane CP corresponds to the line CL. Because of this, the cleavage plane (plane extending in the Y-direction) CP serving as a mirror plane of the resonator of the semiconductor laser shown in FIG. 4 is formed. Furthermore, chips are cut out by cutting along the side extending in the X-direction of the chip area.

It is possible to form the semiconductor laser of the present embodiment, by the above processes.

As described above, according to the present embodiment, by forming the current block layer BL so as to be retracted from the cleavage plane CP over the n-type substrate NS having the off-angle in the <1-100> direction from the (0001) plane, and by crystal-growing the active layer MQW thereover, it is possible to form the active layer MQW in the window area WA in the vicinity of the cleavage plane CP so as to be thinner than the active layer MQW in the current constriction area. The current block layer BL is a layer that defines the current constriction area, and it is possible to provide a layer thickness difference in the active layer MQW without adding a process of forming a new layer or a process of processing the layer.

In other words, as described in Patent documents 1 to 3, it is possible to reduce the layer thickness of the active layer MQW in the window area WA without providing a special configuration portion such as a step on which the active layer is arranged in a position lower than other portions, a single crystal layer separately formed at the emission side end face, and a groove formed in the end face of the semiconductor laser.

As described above, according to the present embodiment, the band gap energy in the window area WA becomes large due to the quantum effect of the active layer MQW and the window area WA becomes transparent to the laser oscillated light, and thus it is possible to suppress the catastrophic optical damage to the light emission end face.

(Second Embodiment)

In the first embodiment, the p-type contact layer PCNT and the p-type clad layer PCLD are not patterned and the semiconductor laser having a planar structure is formed, but it may also be possible to form a semiconductor laser having a ridge structure by patterning the p-type contact layer PCNT and the p-type clad layer PCLD into the shape of a line. Note that the same symbols are attached to the same portions as those in the case of the first embodiment and detailed explanation thereof is omitted.

[Explanation of Structure]

Figure 33:
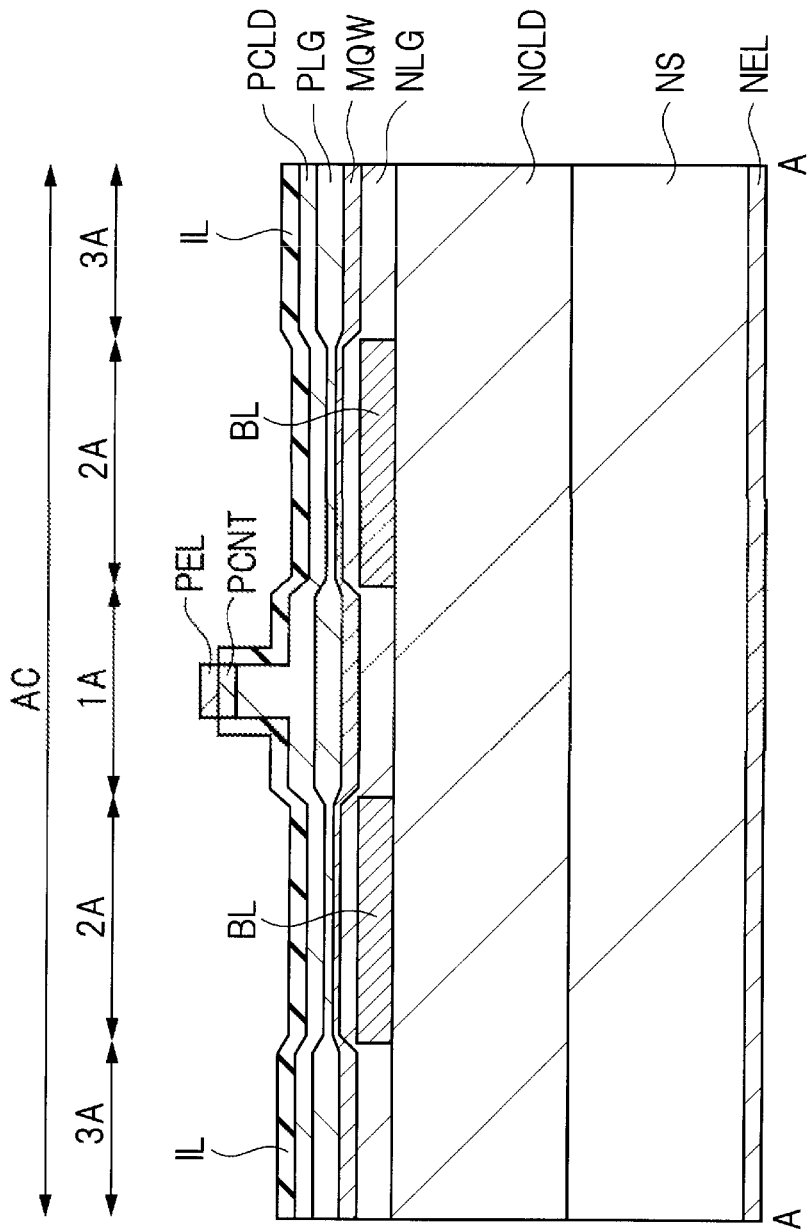
FIG. 33 is a cross-sectional view showing a configuration of a semiconductor laser of a second embodiment.
Figure 34:
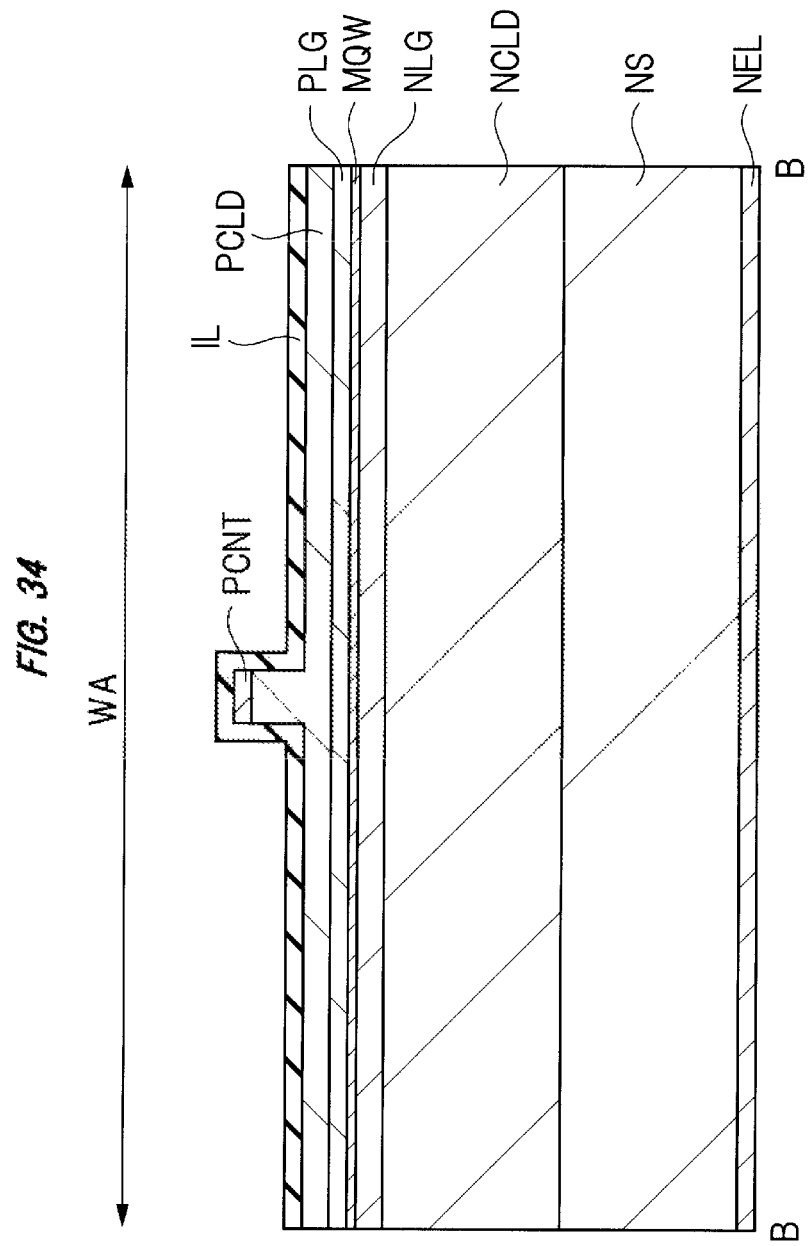
FIG. 34 is a cross-sectional view showing the configuration of the semiconductor laser of the second embodiment.
Figure 35:
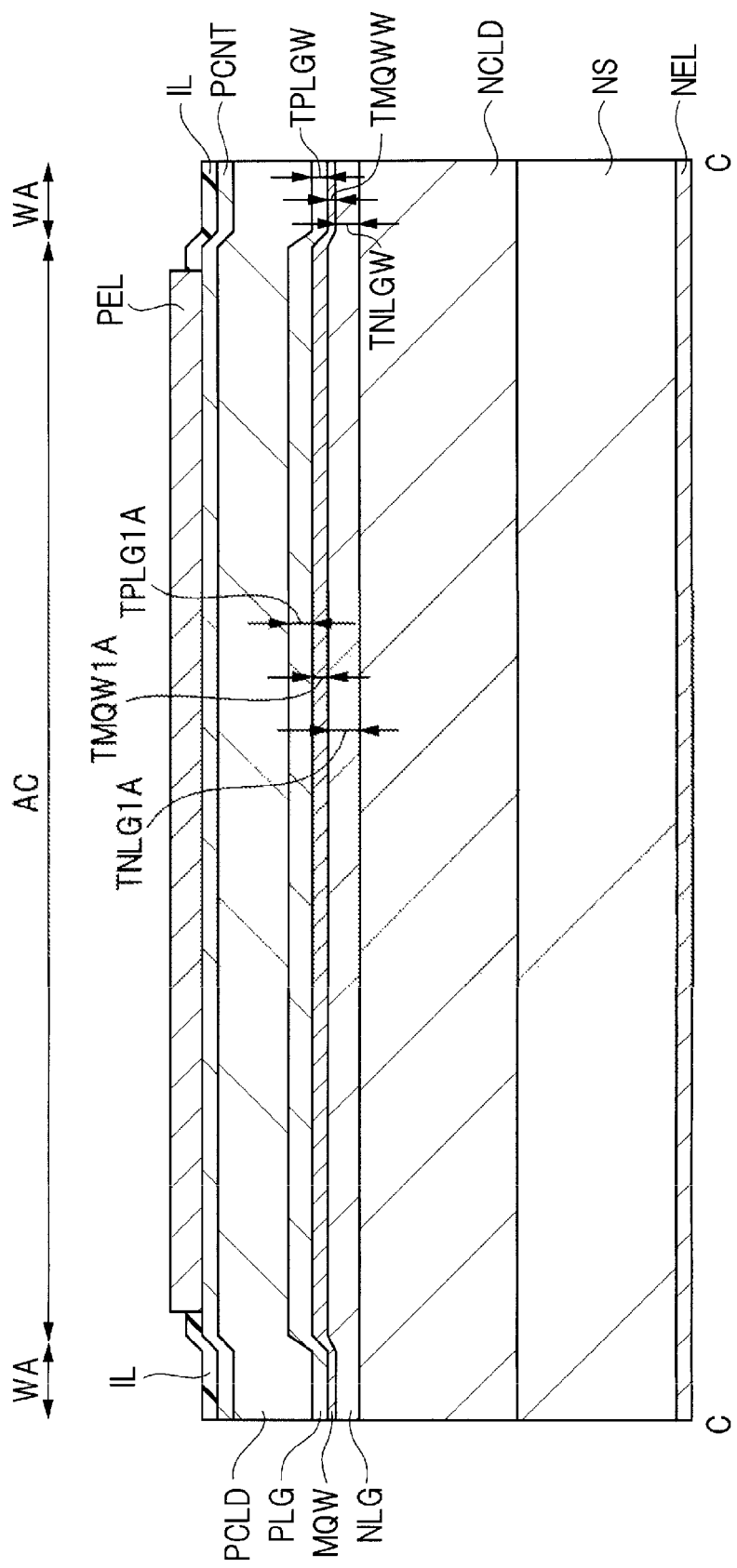
FIG. 35 is a cross-sectional view showing the configuration of the semiconductor laser of the second embodiment.
Figure 36:
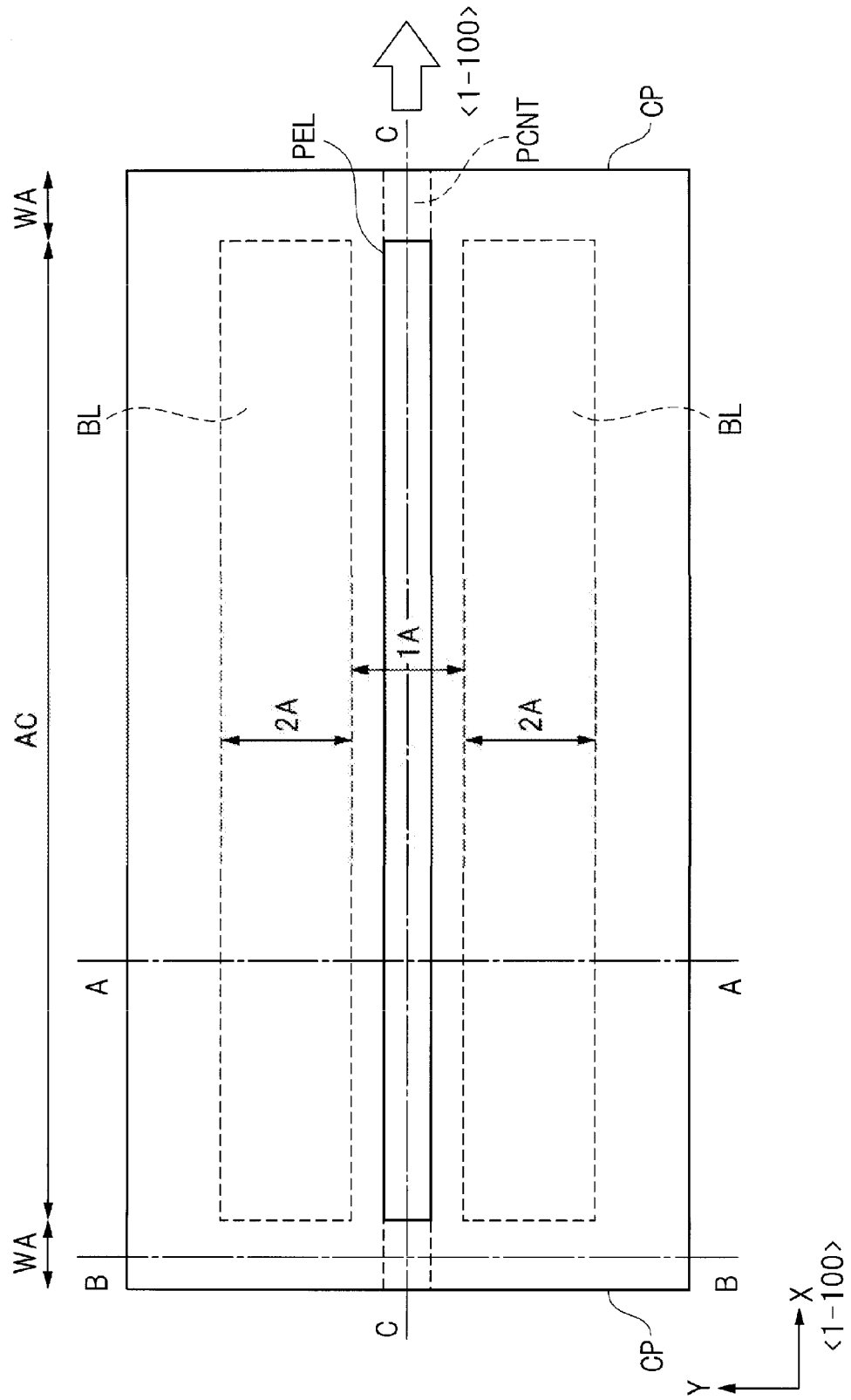
FIG. 36 is a plan view showing the configuration of the semiconductor laser of the second embodiment.

FIG. 33 to FIG. 35 are cross-sectional views showing a configuration of a semiconductor laser of the present embodiment and FIG. 36 is a plan view showing the configuration of the semiconductor laser of the present embodiment. For example, FIG. 33 corresponds to the A-A portion in FIG. 36, FIG. 34 corresponds to the B-B portion in FIG. 36, and FIG. 35 corresponds to the C-C portion in FIG. 36.

As shown in FIG. 33 to FIG. 36, in the semiconductor laser of the present embodiment, the p-type contact layer PCNT and the p-type clad layer PCLD form a stacked layer portion in the shape of a line. The stacked layer portion in the shape of a line may be referred to as a ridge stripe structure.

In the semiconductor laser of the present embodiment, the configuration including the p-type optical guide layer PLG and lower layers over the n-side electrode NEL is the same as that in the first embodiment.

For example, the semiconductor laser of the present embodiment uses the n-type substrate NS having an off-angle inclined in the <1-100> direction from the (0001) plane as a substrate and has a plurality of nitride semiconductor layers sequentially stacked thereover, in the same way as in the first embodiment. Specifically, as in the case of the first embodiment, the n-type clad layer NCLD is arranged over the n-type substrate NS. It is possible to use the same materials as those in the first embodiment, as the materials constituting the n-type substrate NS and the n-type clad layer NCLD.

Then, the current block layer BL is arranged over the n-type clad layer NCLD. It is possible to use the same material as that in the first embodiment, as the material constituting the current block layer BL. The planar shape of the current block layer BL when viewed from the upper face is the same as that in the first embodiment (see FIG. 12). Namely, the two current block layers BL in the shape of a rectangle (quadrangle) having its long side in the <1-100> direction are formed in the active area AC. The two current block layers BL are arranged on both sides of the area 1A serving as the current constriction area, respectively. The n-type clad layer NCLD is exposed between the current block layers BL.

Furthermore, in the same way as in the first embodiment, the n-type optical guide layer NLG, the active layer MQW, and the p-type optical guide layer PLG are sequentially arranged over the current block layer BL and the n-type clad layer NCLD. These layers each have the layer-thickness portions in the same way as in the case of the first embodiment. For example, the layer thickness TMQWW of he window area WA of the active layer MQW is smaller than the layer thickness TMQW1A of the area 1A (current constriction area) in the active area AC (TMQWW<TMQW1A). In addition, it is possible to use the same materials as those in the first embodiment, as the materials constituting these layers.

Here, the p-type clad layer PCLD and the p-type contact layer PCNT are arranged over the p-type optical guide layer PLG, and these layers are arranged mainly in the area 1A. As described above, the stacked layer portion of the p-type clad layer PCLD and the p-type contact layer PCNT extends in the shape of a line (shape of a rectangle having its long side in the X-direction in FIG. 36), over the area (area 1A) between the current block layers BL (see FIG. 33 and FIG. 36).

Then, the sidewall of the stacked layer portion in the shape of a line (ridge stripe portion) is covered with the insulating layer (insulating film) IL. This insulating layer IL is arranged from the sidewall of the ridge stripe portion up to over the p-type clad layers PCLD on both sides thereof. In addition, the p-side electrode PEL is arranged over the p-type contact layer PCNT in the uppermost layer, and the n-side electrode NEL is arranged at the backside of the n-type substrate NS. It is possible to use the same materials as those in the first embodiment, as the materials constituting these.

Furthermore, through the use of the substrate having the off-angle inclined in the <1-100> direction from the (0001) plane, it is possible to form the active layer MQW in the window area WA so as to be thinner than the active layer MQW in the current constriction area (area 1A) because of the presence/absence of the current block layer BL. Because of this, it is possible to suppress the end face destruction due to the catastrophic optical damage to the light emission end face (CP).

Furthermore, in the present embodiment, it is possible to confine the light in the horizontal direction by the ridge stripe portion also in the window area WA in which the current block layer BL is not formed, and thus it is possible to reduce the waveguide loss in the window area WA. Because of this, it is possible to improve the far field pattern (FFP).

In particular, the influence of the waveguide loss is small in the multimode laser element of broad stripe type (the width of the area 1A is about 5 µm or more), but there is a possibility that the influence of the waveguide loss becomes large in the single mode laser element of narrow stripe type (the width of the area 1A is approximately 1 µm to 2 µm), and thus it is preferable to adopt the ridge stripe structure as in the present embodiment.

[Explanation of Manufacturing Method]

Figure 37:
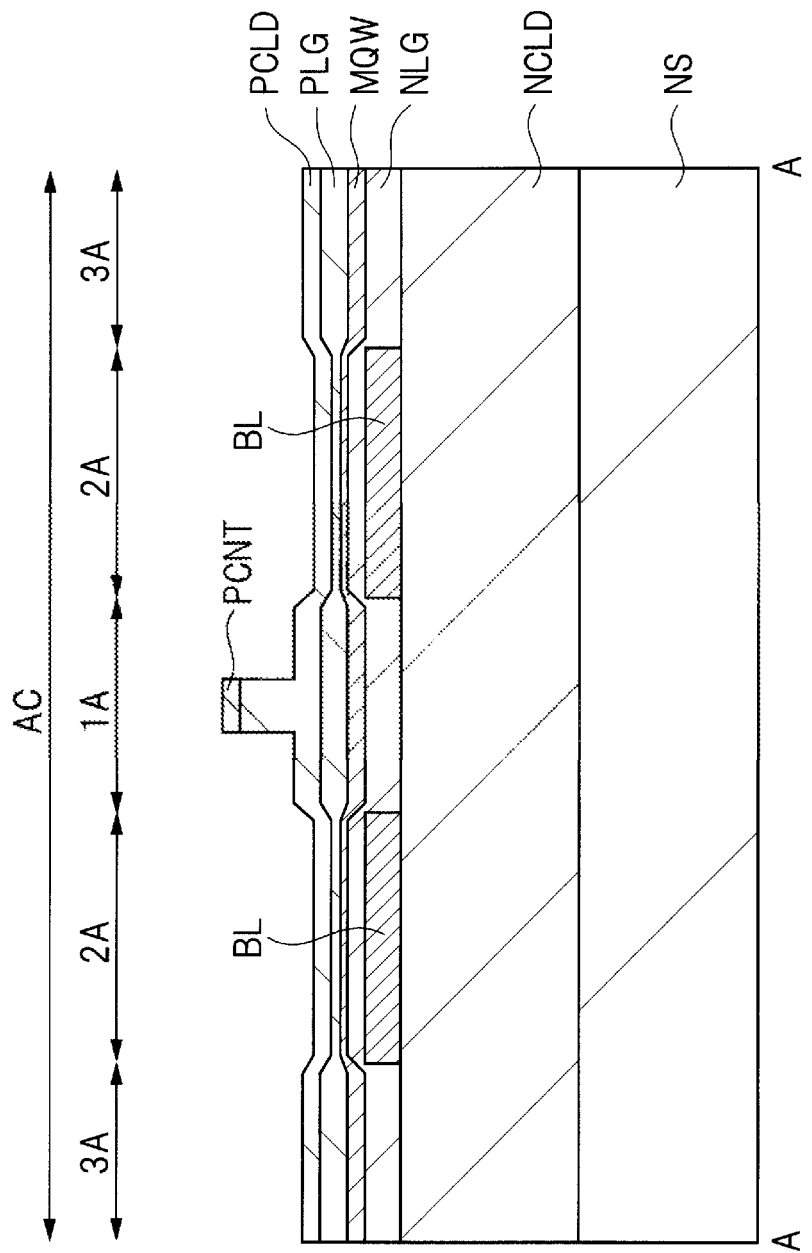
FIG. 37 is a cross-sectional view showing a manufacturing process of a semiconductor laser of the second embodiment.
Figure 38:
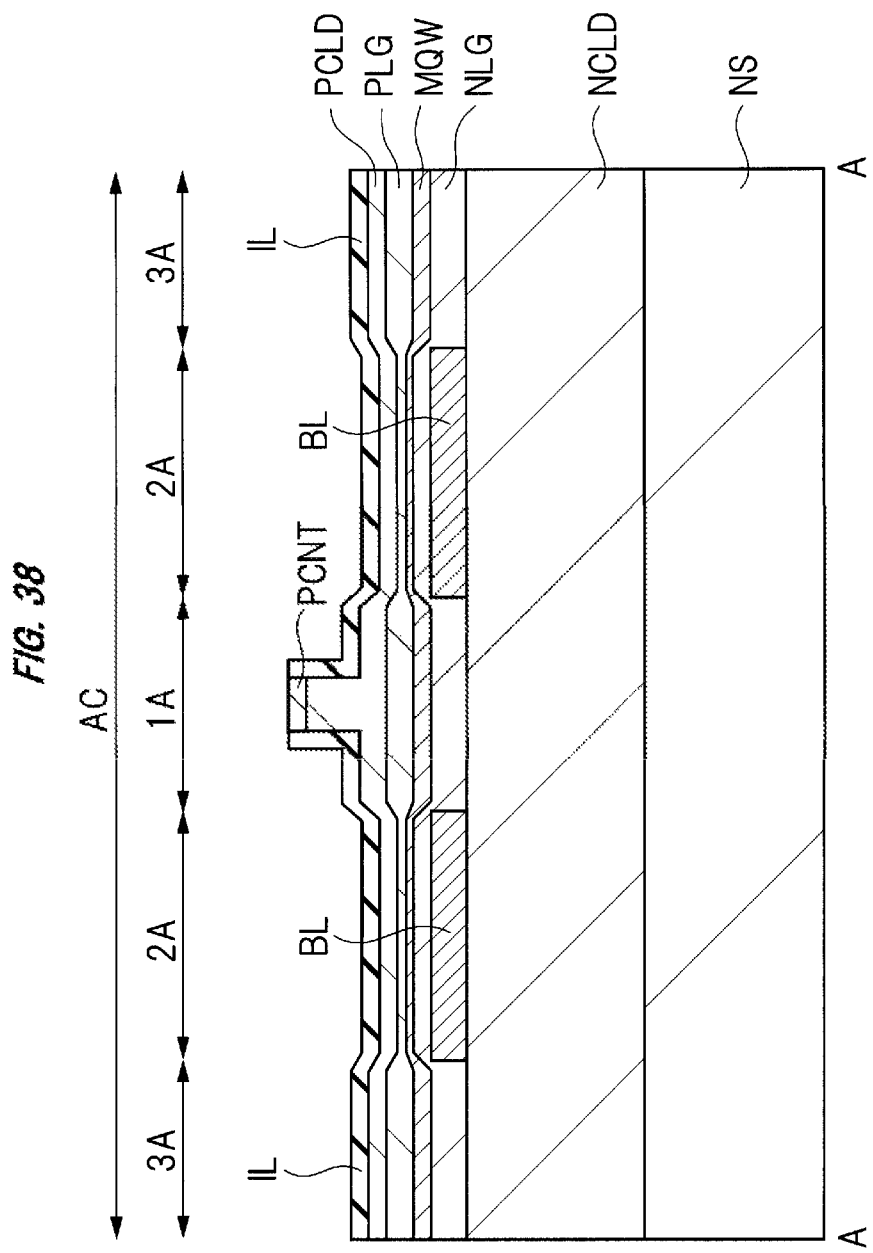
FIG. 38 is a cross-sectional view showing the manufacturing process of the semiconductor laser of the second embodiment, a cross-sectional view showing the manufacturing process that follows FIG. 37.

Next, with reference to FIG. 37 to FIG. 39, the manufacturing method of the semiconductor laser of the present embodiment will be explained, and at the same time, the configuration of the semiconductor laser will be made clearer. FIG. 37 to FIG. 39 are cross-sectional views showing the manufacturing processes of the semiconductor laser of the present embodiment.

As in the first embodiment, the n-type clad layer NCLD, the current block layer BL, the n-type optical guide layer NLG, the active layer MQW, the p-type optical guide layer PLG, the p-type clad layer PCLD, and the p-type contact layer PCNT are sequentially formed over the n-type substrate NS (see FIG. 29).

Subsequently, as shown in FIG. 37, the ridge stripe portion is formed by patterning the p-type contact layer PCNT (p-type GaN layer) and the p-type clad layer PCLD. A hard mask (not shown) is formed over, for example, the p-type contact layer PCNT (p-type GaN layer). A silicon oxide film having a layer thickness of approximately 0.3 µm is formed over the p-type contact layer PCNT (p-type GaN layer) by using, for example, the CVD method or the like. Then, after applying a photoresist film (not shown) over the silicon oxide film, the photoresist film is caused to remain in the area in which the ridge stripe portion is formed by using the photolithography technique. After that, the hard mask (silicon oxide film) is etched by using the photoresist film as a mask. Either the dry etching method or the wet etching method may be used as the etching method. Next, the photoresist film is removed by asking or the like, and the p-type contact layer PCNT (p-type GaN layer) and the p-type clad layer PCLD are etched by the dry etching method by using the hard mask (silicon oxide film) as a mask (FIG. 37). Subsequently, the hard mask is removed. In this way, the ridge stripe portion (stacked layer portion of the p-type clad layer PCLD and the p-type contact layer PCNT) having a width of about 1 µm to 2 µm is formed. The width referred to herein is, for example, the width in the Y-direction in FIG. 36. Here, in FIG. 37, etching is carried out only to the middle of the p-type clad layer PCLD, but the etching of the p-type clad layer PCLD layer may also be carried out until the p-type optical guide layer PLG is exposed.

Subsequently, as shown in FIG. 38, for example, a silicon oxide film is formed over the ridge stripe portion (stacked layer portion of the p-type clad layer PCLD and the p-type contact layer PCNT) and the p-type clad layer PCLD, by using the CVD method or the like as the insulating layer IL. Because of this, the upper face and the side face of the ridge stripe portion are covered with the insulating layer IL (silicon oxide film). Furthermore, the p-type clad layers PCLD on both sides of the ridge stripe portion are covered with the insulating layer IL (silicon oxide film).

Then, the insulating layer IL on the upper face of the ridge stripe portion (stacked layer portion of the p-type clad layer PCLD and the p-type contact layer PCNT) is removed. For example, the insulating layer IL is etched by using a photoresist film (not shown) having an opening over the ridge stripe portion as a mask. After that, the photoresist film is removed by asking or the like.

Next, the p-side electrode PEL is formed on the upper face of the ridge stripe portion (p-type contact layer PCNT) (FIG. 39).

Subsequently, the backside of the n-type substrate NS is set to be the upper face and the thickness of the n-type substrate NS is reduced by grinding the backside of the n-type substrate NS. For example, the n-type substrate NS is made to have a thickness of approximately 100 µm. Then, the n-side electrode NEL is formed at the backside of the n-type substrate NS (FIG. 39). After that, chips are cut out in the same way as in the case of the first embodiment.

By the above processes, it is possible to form the semiconductor laser of the present embodiment.

As described above, also in the present embodiment, as in the same way as in the first embodiment, it is possible to form the active layer MQW in the window area WA so as to be thinner than the active layer MQW in the current constriction area because of the presence/absence of the current block layer BL by using the substrate having the off-angle inclined in the <1-100> direction from the (0001) plane, and thus it is possible to suppress the end face destruction due to the catastrophic optical damage to the light emission end face.

Furthermore, in the present embodiment, also in the window area WA in which the current block layer BL is not formed, it is possible to confine the light in the horizontal direction by the ridge stripe portion, and thus it is possible to reduce the waveguide loss in the window area WA.

As described above, it is possible to manufacture a semiconductor laser having favorable characteristics.

(Third Embodiment)

In the first embodiment, the current block layer BL is not formed in the area 3A (see FIG. 12), but the current block layer BL may be extended from the area 2A to the area 3A.

Furthermore, in the first embodiment, the window area WA is extended in the entire area in the Y-direction of the chip area along the cleavage plane CP (see FIG. 4), but the window area WA is only required to be an area including the light emission portion and having a width greater than that of the area 1A, and it is not necessary to extend the window area WA in the entire area in the Y-direction of the chip area.

(First Example)

FIG. 40 is a plan view showing a first example of the semiconductor laser of the present embodiment. As shown in FIG. 40, in the present embodiment, the current block layer BL is formed in the area 2A and the area 3A shown in FIG. 12. The configurations except for the current block layer BL are the same as those in the case of the first embodiment, and thus explanation thereof is omitted. Moreover, the manufacturing processes of the semiconductor laser of the present embodiment are the same as those in the first embodiment except that the current block layer BL is etched into the shape as shown in FIG. 40.

As described above, the current block layer BL may be extended, in the Y-direction, to the end part (side, the horizontal side in FIG. 40) extending in the X-direction of the chip area (n-type clad layer NCLD).

Second Example

FIG. 41 is a plan view showing a second example of the semiconductor laser of the present embodiment. As shown in FIG. 41, in the present embodiment, the window area WA includes the center line portion (light emission portion) between the current block layers BL and has a width W in the Y-direction larger than the width of the area 1A. Then, the current block layers BL are arranged on both end parts of the side (line CL, cleavage plane CP) extending in the Y-direction of the chip area.

As described above, the window area WA may be arranged along a part of the side (line CL, cleavage plane CP) extending in the Y-direction of the chip area while making the width W in the Y-direction of the window area WA larger than the width in the Y-direction of the area (the first area 1A) between the current block layers BL.

Also in the first example and the second example of the present embodiment, the same effect as that in the first embodiment is exerted. Furthermore, the configuration of the current block layer BL shown in the first example or the second example described above may be applied to the configuration of the second embodiment.

Application Example

The range of the application of the semiconductor laser explained in the above-described embodiments is not limited, and it is possible to apply the semiconductor laser to, for example, an optical disc device. The optical disc device is a device that reads information from an optical disc such as a BD (Blu-lay disc). The operation of reading a signal recorded on the optical disc is performed by an optical pickup. The optical pickup has a light source and a light receiving unit for reading data on the optical disc. It is possible to suppress the catastrophic optical damage to the light emission end face, by using the semiconductor laser explained in the above-described embodiments as the light source of the optical pickup, and to thereby improve the characteristics of the light source.

As above, the invention made by the inventors of the present invention is explained specifically on the basis of the embodiments, but it is needless to say that the present invention is not limited to the above-described embodiments and can be variously modified within the scope not deviating from the gist of the present invention.

For example, in the first to third embodiments described above, the case of the semiconductor laser using the nitride semiconductor among the group III to V compound semiconductors is explained, but the first to third embodiments described above may be applied to a semiconductor laser using another group III to V compound semiconductor.

What is claimed is:

1. A semiconductor device comprising:
   a substrate;
   a first nitride semiconductor layer arranged over a major plane of the substrate;
   a second nitride semiconductor layer arranged over the first nitride semiconductor layer;
   a third nitride semiconductor layer arranged over the second nitride semiconductor layer:
   a fourth nitride semiconductor layer arranged between the first nitride semiconductor layer and the second nitride semiconductor layer; and
   a side face at which the second nitride semiconductor layer is exposed,
   wherein the side face extends in a first direction,
   wherein the fourth nitride semiconductor layer is arranged being retracted from the side face, in second areas on both sides of a first area extending in a second direction that intersects the first direction,
   wherein a band gap of the first nitride semiconductor layer, which is a first conductive type, is larger than that of the second nitride semiconductor layer,
   wherein a band gap of the third nitride semiconductor layer, which is a second conductive type that is a opposite conductive type of the first conductive type, is larger than that of the second nitride semiconductor layer;

wherein a band gap of the fourth nitride semiconductor layer, which contains Al, is larger than that of the third nitride semiconductor layer;

wherein the major plane of the substrate has an off-angle in a <1-100> direction from a (0001) plane, and wherein a layer thickness of a third area from the side face of the second nitride semiconductor layer up to an end part of the fourth nitride semiconductor layer is smaller than a layer thickness of the first area.

2. The semiconductor device according to claim 1, further comprising a fifth nitride semiconductor layer arranged between the second nitride semiconductor layer and the fourth nitride semiconductor layer, wherein the second nitride semiconductor layer is arranged over the fifth nitride semiconductor layer.

3. The semiconductor device according to claim 2, wherein a layer thickness of the third area of the fifth nitride semiconductor layer is smaller than a layer thickness of the first area.

4. The semiconductor device according to claim 1, further comprising a sixth nitride semiconductor layer arranged between the second nitride semiconductor layer and the third nitride semiconductor layer, wherein the sixth nitride semiconductor layer is arranged over the second nitride semiconductor layer.

5. The semiconductor device according to claim 1, wherein the second direction is the <1-100> direction.

6. The semiconductor device according to claim 5, wherein the planar shape of the fourth nitride semiconductor layer is the shape of a quadrangle having its long side in the <1-100> direction.

7. The semiconductor device according to claim 1, wherein the fourth nitride semiconductor layer is an aluminum nitride layer or an aluminum gallium nitride layer.

8. The semiconductor device according to claim 7, wherein the first nitride semiconductor layer is an aluminum gallium nitride layer obtained by introducing n-type impurities, wherein the second nitride semiconductor layer is a stacked layer in which a first indium gallium nitride layer and a second indium gallium nitride layer having different indium compositions are alternately stacked, and wherein the third nitride semiconductor layer has an aluminum gallium nitride layer obtained by introducing p-type impurities.

9. The semiconductor device according to claim 1, wherein the third area is arranged along an entire area of the side face.

10. The semiconductor device according to claim 9, wherein the fourth nitride semiconductor layer extends to an end part of the first nitride semiconductor layer, the end part extending in the second direction.

11. The semiconductor device according to claim 1, wherein the third area is arranged along a part of the side face between the part of the side face and the first area, and wherein a width in the first direction of the third area is greater than the width in the first direction of the first area.

12. The semiconductor device according to claim 1, wherein the third nitride semiconductor layer extends to the side face in the form of a line in the <1-100> direction over the first area.

13. The semiconductor device according to claim 12, wherein a width in the first direction of the third nitride semiconductor layer in the form of a line is smaller than a width in the first direction of the first area.

14. A manufacturing method of a semiconductor device comprising the steps of:

(a) forming a first nitride semiconductor layer over a substrate whose major plane has an off-angle in a <1-100>direction from a (0001) plane;

(b) forming a second nitride semiconductor layer over the first nitride semiconductor layer;

(c) causing the second nitride semiconductor layer to remain, so as to be arranged being retracted from a side face line, in second areas on both sides of a first area extending in a second direction that intersects the side face line extending in a first direction of the first nitride semiconductor layer by etching the second nitride semiconductor layer; and (d) forming a third nitride semiconductor layer over the first nitride semiconductor layer and the second nitride semiconductor layer.

15. The manufacturing method of a semiconductor device according to claim 14, wherein the (d) step is a step of crystal-growing the third nitride semiconductor layer, in which the third nitride semiconductor layer is formed so that a layer thickness of a third area from the side face line up to an end part of the second nitride semiconductor layer is smaller than a layer thickness of the first area.

16. The manufacturing method of a semiconductor device according to claim 15, further comprising a step of (e), after the (d) step, forming a fourth nitride semiconductor layer over the third nitride semiconductor layer.

17. The manufacturing method of a semiconductor device according to claim 16, further comprising a step of (f), after the (e) step, causing the fourth nitride semiconductor layer in the form of a line to remain over the first area by etching the fourth nitride semiconductor layer.

18. The manufacturing method of a semiconductor device according to claim 16, wherein a width in the first direction of the fourth nitride semiconductor layer in the form of a line is less than a width in the first direction of the first area.

19. The manufacturing method of a semiconductor device according to claim 14, wherein a planar shape of the second nitride semiconductor layer is a shape of a quadrangle having its long side in the <1-100> direction.

20. The manufacturing method of a semiconductor device according to claim 14, wherein the fourth nitride semiconductor layer is an aluminum nitride layer or an aluminum gallium nitride layer.

* * * * *